United States Patent
Hayama et al.

(10) Patent No.: US 10,304,694 B2
(45) Date of Patent: May 28, 2019

(54) SEMICONDUCTOR TREATMENT COMPOSITION AND TREATMENT METHOD

(71) Applicant: JSR CORPORATION, Minato-ku (JP)

(72) Inventors: Takahiro Hayama, Minato-ku (JP);
Yasutaka Kamei, Minato-ku (JP);
Naoki Nishiguchi, Minato-ku (JP);
Satoshi Kamo, Minato-ku (JP);
Tomotaka Shinoda, Minato-ku (JP)

(73) Assignee: JSR Corporation, Minato-ku (JP)

( * ) Notice: Subject to any disclaimer, the term of this patent is extended or adjusted under 35 U.S.C. 154(b) by 0 days.

(21) Appl. No.: 15/608,176

(22) Filed: May 30, 2017

(65) Prior Publication Data

US 2018/0226267 A1    Aug. 9, 2018

(30) Foreign Application Priority Data

Feb. 8, 2017  (KR) .................. 10-2017-0017335

(51) Int. Cl.
| | | |
|---|---|---|
| *H01L 21/321* | (2006.01) | |
| *H01L 21/306* | (2006.01) | |
| *B24B 37/04* | (2012.01) | |
| *B24B 49/16* | (2006.01) | |

(52) U.S. Cl.
CPC .... *H01L 21/3212* (2013.01); *H01L 21/30625* (2013.01); *B24B 37/042* (2013.01); *B24B 49/16* (2013.01); *H01L 21/30604* (2013.01)

(58) Field of Classification Search
CPC ......... H01L 21/30604; H01L 21/30617; H01L 21/30625; H01L 21/32115; H01L 21/3212; H01L 21/321; H01L 21/306; B24B 37/042; B24B 49/16
USPC ....... 252/79.1, 79, 79.3, 79.4; 438/692, 693, 438/691; 216/96, 102, 105
See application file for complete search history.

(56) References Cited

U.S. PATENT DOCUMENTS

| | | | | |
|---|---|---|---|---|
| 7,316,976 | B2 * | 1/2008 | Nojo ...................... | B24B 37/044 257/E21.244 |
| 8,759,231 | B2 * | 6/2014 | Sun ...................... | H01L 31/0236 216/99 |
| 2008/0257862 | A1 * | 10/2008 | Belov ...................... | C09G 1/02 216/41 |
| 2010/0099260 | A1 * | 4/2010 | Matsumoto .............. | C09G 1/02 438/693 |
| 2015/0337245 | A1 * | 11/2015 | Hayama .............. | C11D 11/0047 510/175 |
| 2015/0368597 | A1 * | 12/2015 | Eto ...................... | C11D 11/0047 438/637 |

FOREIGN PATENT DOCUMENTS

| | | |
|---|---|---|
| JP | 2009-55020 | 3/2009 |
| JP | 2010-258014 | 11/2010 |
| JP | 2013-157516 | 8/2013 |

* cited by examiner

*Primary Examiner* — Lan Vinh
(74) *Attorney, Agent, or Firm* — Oblon, McClelland, Maier & Neustadt, L.L.P.

(57) ABSTRACT

A semiconductor treatment composition includes potassium, sodium, and a compound A represented by the formula (1), and has a potassium content $M_K$ (ppm) and a sodium content $M_{Na}$ (ppm) that satisfy $M_K/M_{Na}=1\times10^{-1}$ to $1\times10^4$.

11 Claims, 2 Drawing Sheets

SEMICONDUCTOR TREATMENT COMPOSITION AND TREATMENT METHOD

Korean Patent Application No. 2017-0017335, filed on Feb. 8, 2017, is hereby incorporated by reference in its entirety.

BACKGROUND OF THE INVENTION

The present invention relates to a semiconductor treatment composition, and a treatment method that utilizes the semiconductor treatment composition.

Chemical mechanical polishing (CMP) that is used to produce a semiconductor device is a technique that causes the processing target (polishing target) and a polishing pad to come in sliding contact with each other while pressing the processing target against the polishing pad, and supplying a chemical mechanical polishing aqueous dispersion (hereinafter may be referred to as "CMP slurry") to the polishing pad to chemically and mechanically polish the processing target. The CMP slurry includes abrasive grains, and a chemical such as an etchant, and polishing waste (debris) is formed during CMP. A fatal device defect may occur if such polishing waste remains. Therefore, it is indispensable to perform a cleaning step after completion of CMP.

A metal wire material (e.g., copper and tungsten), an insulating material (e.g., silicon oxide), a barrier metal material (e.g., tantalum nitride and titanium nitride), and the like are exposed on the surface of the processing target that has been subjected to CMP. When such different materials are present on the polished surface, it is necessary to remove only contaminants from the polished surface so that damage such as corrosion does not occur. For example, JP-A-2010-258014 discloses technology that suppresses corrosion of the polished surface on which the wiring material and the barrier metal material are exposed, by utilizing an acidic semiconductor treatment composition. JP-A-2009-055020 and JP-A-2013-157516 disclose technology that treats the polished surface on which the wiring material and the barrier metal material (e.g., cobalt) are exposed, by utilizing a neutral to alkaline semiconductor treatment composition.

SUMMARY

However, the circuit structure has been further refined in recent years, and it has been desired to provide a treatment technique that can further reduce damage applied to a metal wire and the like that are included in the treatment target, and can still effectively remove contaminants from the surface of the treatment target.

For example, when subjecting a polishing target that includes a tungsten wire to CMP, a CMP slurry that includes iron nitrate and an additional oxidizing agent (e.g., hydrogen peroxide and potassium iodate) is used. Since an iron ion included in the CMP slurry is easily adsorbed on the surface of the polishing target, the polishing target surface is easily contaminated with iron. Iron can be removed by treating the polished surface using diluted hydrofluoric acid. In this case, however, the polished surface is easily etched and damaged. Therefore, it has been desired to provide a treatment technique that can reduce damage applied to a metal wire and the like included in the treatment target as much as possible, and can still effectively remove contaminants from the surface of the treatment target.

Several aspects of the invention may solve at least some of the above problems, and may provide a semiconductor treatment composition that is superior in productivity, can reduce damage applied to a metal wire and the like that are included in the treatment target, and can still effectively remove contaminants from the surface of the treatment target, and a treatment method that utilizes the semiconductor treatment composition.

The invention may be implemented as described below (see the following application examples).

Application Example 1

According to a first aspect of the invention, there is provided a concentrated semiconductor treatment composition including potassium, sodium, and a compound A represented by the following general formula (1), the concentrated semiconductor treatment composition having a potassium content $M_K$ (ppm) and a sodium content $M_{Na}$ (ppm) that satisfy $M_K/M_{Na}=1\times10^{-1}$ to $1\times10^4$:

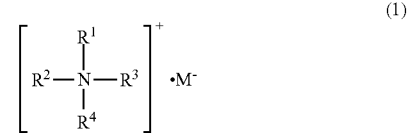

wherein each of $R^1$ to $R^4$ is a hydrogen atom or an organic group, independently, and $M^-$ is an anion.

Application Example 2

The concentrated semiconductor treatment composition according to Application Example 1 may be used in a 1 to 500-fold diluted state.

Application Example 3

According to a second aspect of the invention, there is provided a semiconductor treatment composition including potassium, sodium and a compound A represented by the following general formula (1), and being used without being diluted, the semiconductor treatment composition having a potassium content $M_K$ (ppm) and a sodium content $M_{Na}$ (ppm) that satisfy $M_K/M_{Na}=1\times10^{-1}$ to $1\times10^4$:

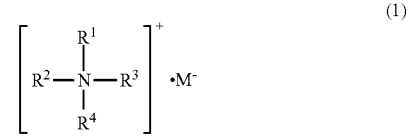

wherein each of $R^1$ to $R^4$ is a hydrogen atom or an organic group, independently, and $M^-$ is an anion.

Application Example 4

The semiconductor treatment composition according to any one of Application Examples 1 to 3 may have a viscosity less than 5 mPa·s at 25° C.

Application Example 5

The semiconductor treatment composition according to any one of Application Examples 1 to 4 may further include an organic acid.

Application Example 6

The semiconductor treatment composition according to any one of Application Examples 1 to 5 may further include a water-soluble polymer.

Application Example 7

According to a third aspect of the invention, there is provided a treatment method including:

treating a wiring board by using the semiconductor treatment composition according to any one of Application Examples 1 to 6, the wiring board containing a wiring material and a barrier metal material, the wiring material containing copper or tungsten, and the barrier metal material containing at least one material selected from the group consisting of tantalum, titanium, cobalt, ruthenium, manganese, and compounds thereof.

Application Example 8

According to a fourth aspect of the invention, there is provided a treatment method including:

treating a wiring board that contains tungsten as a wiring material by using the semiconductor treatment composition according to any one of Application Examples 1 to 6, after subjection the wiring board to chemical mechanical polishing by using a composition that contains iron ions and peroxides.

ADVANTAGEOUS EFFECTS OF INVENTION

Figure 1:
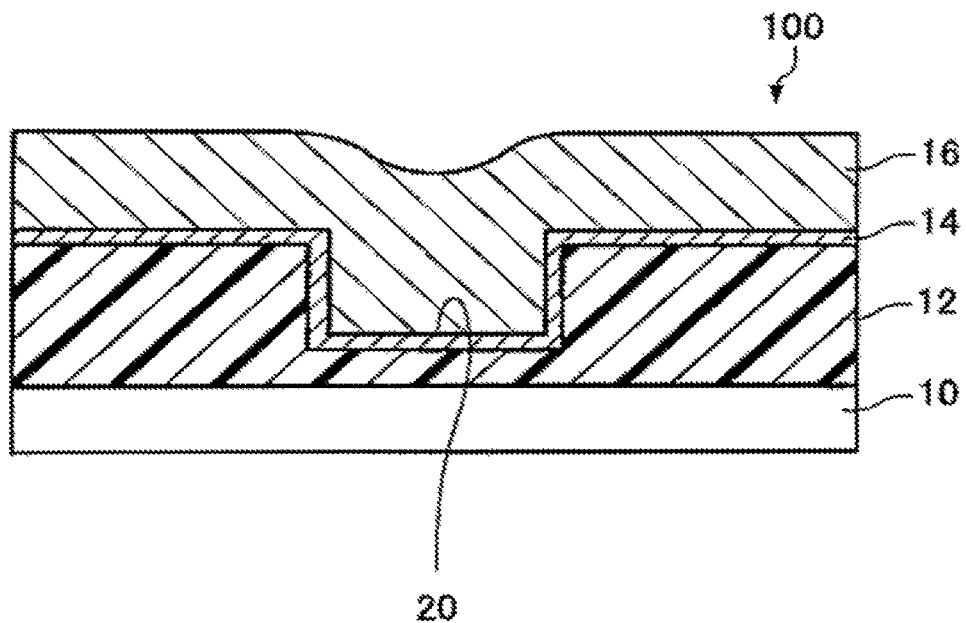
FIG. 1 is a cross-sectional view schematically illustrating a process that produces a wiring board that is used in connection with a treatment method according to one embodiment of the invention.

The semiconductor treatment composition according to one embodiment of the invention has an excellent filtration characteristic, thereby being superior in productivity. In addition, the semiconductor treatment composition according to the embodiment of the invention can reduce damage applied to a metal wire and the like included in the processing target, and can still effectively remove contaminants from the surface of the processing target.

DETAILED DESCRIPTION OF THE EMBODIMENT

The exemplary embodiments of the invention are described in detail below. Note that the invention is not limited to the exemplary embodiments described below. The invention includes various modifications that may be implemented without departing from the scope of the invention.

1. SEMICONDUCTOR TREATMENT COMPOSITION

A semiconductor treatment composition according to one embodiment of the invention includes potassium, sodium, and a compound A represented by the following general formula (1), and has a potassium content $M_K$ (ppm) and a sodium content $M_{Na}$ (ppm) that satisfy $M_K/M_{Na}=1\times10^{-1}$ to $1\times10^4$. The semiconductor treatment composition may be a concentrated-type semiconductor treatment composition that is used after being diluted with a liquid medium (e.g., purified water and organic solvent), or may be a non-dilution-type semiconductor treatment composition that is used without being diluted. The term "semiconductor treatment composition" used herein includes both the concentrated-type semiconductor treatment composition and the non-dilution-type semiconductor treatment composition unless otherwise specified.

The semiconductor treatment composition may be used as a treatment agent such as a cleaning agent for removing particles, metal impurities, and the like present on the surface of the treatment target (polishing target) after completion of CMP, a resist stripper for removing a resist from a semiconductor substrate that has been processed using a resist, and an etchant for shallowly etching the surface of a metal wire or the like to remove a surface contaminant. Note that the term "treatment agent" used herein includes a cleaning agent for cleaning a semiconductor surface, a resist stripper, an etchant, and the like. Each component included in the semiconductor treatment composition is described in detail below.

1.1 Potassium and Sodium

The semiconductor treatment composition includes potassium and sodium. It is generally considered that an alkali metal such as sodium and potassium is an impurity that should be removed as much as possible during a semiconductor production process (see JP-A-2000-208451, for example). However, it was found contrary to the above concept that it is possible to improve treatment performance without causing significant deterioration in semiconductor properties by utilizing a semiconductor treatment composition that includes potassium and sodium in a predetermined ratio when implementing a cleaning step that is performed after completion of CMP, a resist removal step, an etching step, and the like.

The semiconductor treatment composition has a potassium content $M_K$ (ppm) and a sodium content $M_{Na}$ (ppm) that satisfy $M_K/M_{Na}=1\times10^{-1}$ to $1\times10^4$, preferably $M_K/M_{Na}=3\times10^{-1}$ to $7\times10^3$, more preferably $M_K/M_{Na}=5\times10^{-1}$ to $5\times10^3$, and particularly preferably $M_K/M_{Na}=1\times10^0$ to $4\times10^3$. It is considered that, when the content ratio of potassium to sodium is within the above range, it is possible to suppress a situation in which a metal material (e.g., copper and tungsten) that is exposed on the treatment target surface is etched to an excessive extent, and eluted during the semiconductor treatment step. If the content ratio of potassium to sodium in the semiconductor treatment composition exceeds the above range, sodium and potassium may adhere to and remain on the treatment target, and the electrical characteristics of the resulting semiconductor circuit (i.e., treatment target) may deteriorate, whereby a decrease in yield and the like may occur. If the content ratio of potassium to sodium in the semiconductor treatment composition is less than the above range, the balance with respect to the ionic product of a metal material (e.g., copper and tungsten) that is exposed on the treatment target surface, and sodium and potassium included in the semiconductor treatment composition may be impaired, and the metal material (e.g., copper and tungsten) may be etched to an excessive extent, whereby deterioration in the flatness of the treatment target surface and electrical characteristics may occur.

It is preferable that the concentrated-type semiconductor treatment composition have a sodium content of $1\times10^{-6}$ to $1\times10^{2}$ ppm, more preferably $1\times10^{-5}$ to $5\times10^{1}$ ppm, and particularly preferably $1\times10^{-4}$ to $5\times10^{0}$ ppm. It is preferable that the concentrated-type semiconductor treatment composition have a potassium content of $1\times10^{-4}$ to $5\times10^{3}$ ppm, more preferably $5\times10^{-4}$ to $3\times10^{3}$ ppm, and particularly preferably $1\times10^{-3}$ to $2\times10^{3}$ ppm.

It is preferable that the non-dilution-type semiconductor treatment composition have a sodium content of $1\times10^{-8}$ to $1\times10^{2}$ ppm, more preferably $1\times10^{-7}$ to $5\times10^{1}$ ppm, and particularly preferably $1\times10^{-6}$ to $5\times10^{0}$ ppm. It is preferable that the non-dilution-type semiconductor treatment composition have a potassium content of $1\times10^{-6}$ to $5\times10^{3}$ ppm, more preferably $5\times10^{-6}$ to $3\times10^{3}$ ppm, and particularly preferably $1\times10^{-5}$ to $2\times10^{3}$ ppm.

It is considered that, when the content ratio of potassium to sodium, the potassium content, and the sodium content in the semiconductor treatment composition are within the above ranges, it is possible to more effectively suppress a situation in which a metal material (e.g., copper and tungsten) that is exposed on the treatment target surface is etched to an excessive extent, and eluted during the treatment step, and maintain stable treatment performance.

Potassium and sodium may be used in the form of a water-soluble salt when producing the semiconductor treatment composition. Examples of the water-soluble salt of potassium/sodium include a salt of potassium/sodium hydroxide, potassium/sodium carbonate, a potassium/sodium ammonium salt, a potassium/sodium halide, and the like.

The potassium content $M_{K}$ (ppm) and the sodium content $M_{Na}$ (ppm) in the semiconductor treatment composition may be calculated by subjecting the semiconductor treatment composition to ICP atomic emission spectrometry (ICP-AES), ICP mass spectrometry (ICP-MS), or atomic absorption spectrophotometry (AA). An ICP atomic emission spectrometer "ICPE-9000" (manufactured by Shimadzu Corporation) or the like may be used for ICP atomic emission spectrometry. An ICP mass spectrometer "ICPE-8500" (manufactured by Shimadzu Corporation), "ELAN DRC PLUS" (manufactured by Perkin-Elmer), or the like may be used for ICP mass spectroscopy. An atomic absorption spectrophotometer "AA-7000" (manufactured by Shimadzu Corporation), "ZA3000" (manufactured by Hitachi High-Tech Science Corporation), or the like may be used for atomic absorption spectrophotometry.

When subjecting a treatment target (polishing target) that includes tungsten as a wiring material to CMP, a CMP slurry that includes an iron ion and a peroxide (e.g., hydrogen peroxide and potassium iodate) is used. Since the iron ion included in the CMP slurry is easily adsorbed on the surface of the treatment target (polishing target), the polishing target surface is easily contaminated with iron. In this case, when the polishing target surface is cleaned (washed) using the semiconductor treatment composition, production of a soluble salt (e.g., potassium tungstate and sodium tungstate) is promoted during the cleaning step. This makes it possible to reduce contamination of the wiring board with a metal, and efficiently remove a polishing residue while reducing damage applied to the treatment target.

1.2. Compound A

The semiconductor treatment composition according to one embodiment of the invention includes a compound A represented by the following general formula (1) (hereinafter may be referred to as a "compound A"). The compound A is used to adjust the pH of the semiconductor treatment composition and remove the organic residue:

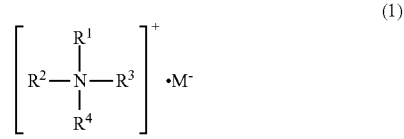

wherein each of $R^1$ to $R^4$ is a hydrogen atom or an organic group, independently, and $M^-$ is an anion.

In the general formula (1) above, it is preferable that a hydrocarbon group be used as the organic group represented by $R^1$ to $R^4$. Examples of the hydrocarbon group may include any one of an aliphatic hydrocarbon group, an aromatic hydrocarbon group, an araliphatic hydrocarbon group, or alicyclic hydrocarbon group, and may include a hetero atom such as an oxygen atom, a sulfur atom, and a halogen atom; a part of the hydrocarbon group may be substituted with an additional substituent. The aliphatic hydrocarbon group and the aliphatic group of araliphatic hydrocarbon group may be a saturated or unsaturated aliphatic hydrocarbon group and may be a linear or branched-chain group. Examples of these hydrocarbon groups may include a saturated or unsaturated alkyl group, aralkyl group, aryl group, or the like which is a linear, branched-chain, or cyclic group.

Examples of the alkyl group may include generally preferably a lower alkyl group having 1 to 6 carbon atoms, and particularly preferably a lower alkyl group having 1 to 4 carbon atoms, and may include a substituent such as a halogen atom and a hydroxyl group. Specifically, examples of the alkyl group may include a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a neopentyl group, an n-hexyl group, an iso-hexyl group, a sec-hexyl group, a tert-hexyl group, a cyclopentyl group, a cyclohexyl group, a vinyl group, an n-propenyl group, an iso-propenyl group, an n-butenyl group, an iso-butenyl group, a sec-butenyl group, a tert-butenyl group, and the like.

Examples of the aralkyl group may generally preferably include an aralkyl group having 7 to 12 carbon atoms. Specifically, examples of the aralkyl group may include a benzyl group, a phenethyl group, a phenylpropyl group, a phenylbutyl group, a phenylhexyl group, a methylbenzyl group, a methylphenethyl group, an ethylbenzyl group, and the like.

Examples of the aryl group may generally preferably include a aryl group having 6 to 14 carbon atoms. Specifically, examples of the aryl group may include a phenyl group, an o-tolyl group, an m-tolyl group, a p-tolyl group, a 2,3-xylyl group, a 2,4-xylyl group, a 2,5-xylyl group, a 2,6-xylyl group, a 3,5-xylyl group, a naphthyl group, an anthryl group, and the like.

An aromatic ring of the aryl group or the aralkyl group may include a lower alkyl group such as a methyl group and an ethyl group, a halogen atom, a nitro group, an amino group, or the like as a substituent.

In the general formula (1) above, examples of an anion represented by $M^-$ may include a hydroxide ion ($OH^-$) and the like.

The compound represented by the general formula (1) above may be a quaternary ammonium compound. Specific examples of the quaternary ammonium compound include tetramethylammonium hydroxide (TMAH), trimethyl-2-hydroxyethylammonium hydroxide (choline), tetraethylammonium hydroxide (TEAH), tetrapropyl ammonium hydroxide, tetrabutyl ammonium hydroxide, monomethyl triethyl ammonium hydroxide, dimethyl diethyl ammonium hydroxide, trimethyl monoethyl ammonium hydroxide, monomethyl tripropyl ammonium hydroxide, dimethyl dipropyl ammonium hydroxide, trimethyl monopropyl ammonium hydroxide, monomethyl tributyl ammonium hydroxide, dimethyl dibutyl ammonium hydroxide, trimethyl monobutyl ammonium hydroxide, monoethyl tripropyl ammonium hydroxide, diethyl dipropyl ammonium hydroxide, triethyl monopropyl ammonium hydroxide, monoethyl tributyl ammonium hydroxide, diethyl dibutyl ammonium hydroxide, triethyl monobutyl ammonium hydroxide, monopropyl tributyl ammonium hydroxide, dipropyl dibutyl ammonium hydroxide, tripropyl monobutyl ammonium hydroxide, triethyl-2-hydroxyethyl ammonium hydroxide, tripropyl-2-hydroxyethyl ammonium hydroxide, tributyl-2-hydroxyethyl ammonium hydroxide, trimethyl-3-hydroxypropyl ammonium hydroxide, triethyl-3-hydroxypropyl ammonium hydroxide, tripropyl-3-hydroxypropyl ammonium hydroxide, tributyl-3-hydroxypropyl ammonium hydroxide, trimethyl-4-hydroxybutyl ammonium hydroxide, triethyl-4-hydroxybutyl ammonium hydroxide, tripropyl-4-hydroxybutyl ammonium hydroxide, tributyl-4-hydroxybutyl ammonium hydroxide, trimethyl-3-hydroxybutyl ammonium hydroxide, triethyl-3-hydroxybutyl ammonium hydroxide, tripropyl-3-hydroxybutyl ammonium hydroxide, tributyl-3-hydroxybutyl ammonium hydroxide, dimethylethyl-2-hydroxyethyl ammonium hydroxide, methyldiethyl-2-hydroxyethyl ammonium hydroxide, dimethylethyl-3-hydroxypropyl ammonium hydroxide, methyldiethyl-3-hydroxypropyl ammonium hydroxide, dimethylethyl-4-hydroxybutyl ammonium hydroxide, methyldiethyl-4-hydroxybutyl ammonium hydroxide, dimethylethyl-3-hydroxybutyl ammonium hydroxide, methyldiethyl-3-hydroxybutyl ammonium hydroxide, dimethyl di (2-hydroxyethyl) ammonium hydroxide, dimethyl di (3-hydroxypropyl) ammonium hydroxide, dimethyl di (3-hydroxybutyl) ammonium hydroxide, dimethyl di (4-hydroxybutyl) ammonium hydroxide, diethyl di (2-hydroxyethyl) ammonium hydroxide, diethyl di (3-hydroxypropyl) ammonium hydroxide, diethyl di (3-hydroxybutyl) ammonium hydroxide, diethyl di (4-hydroxybutyl) ammonium hydroxide, methyl ethyl di (2-hydroxyethyl) ammonium hydroxide, methyl ethyl di (3-hydroxypropyl) ammonium hydroxide, methyl ethyl di (4-hydroxybutyl) ammonium hydroxide, methyl tri (2-hydroxyethyl) ammonium hydroxide, ethyl tri (2-hydroxyethyl) ammonium hydroxide, propyl tri (2-hydroxyethyl) ammonium hydroxide, butyl tri (2-hydroxyethyl) ammonium hydroxide, methyl tri (3-hydroxypropyl) ammonium hydroxide, ethyl tri (3-hydroxybutyl) ammonium hydroxide, methyl tri (4-hydroxybutyl) ammonium hydroxide, ethyl tri (4-hydroxybutyl) ammonium hydroxide, methyl tri (3-hydroxybutyl) ammonium hydroxide, and the like. Among these, tetramethylammonium hydroxide (TMAH) may be used particularly preferably. These quaternary ammonium compounds may be used either alone or in combination.

The content of the compound A in the semiconductor treatment composition may be appropriately changed taking account of a metal wire material (e.g., copper and tungsten), an insulating material (e.g., silicon oxide), a barrier metal material (e.g., tantalum nitride and titanium nitride), and the like that are exposed on the surface of the treatment target that has been subjected to CMP, and the composition of the CMP slurry.

The content of the compound A in the semiconductor treatment composition may also be appropriately changed taking account of the degree of dilution with respect to the concentrated-type semiconductor treatment composition. The content of the compound A in the semiconductor treatment composition is preferably 0.0001 to 10 parts by mass, more preferably 0.001 to 5 parts by mass, and particularly preferably 0.01 to 3 parts by mass based on 100 parts by mass of a treatment agent prepared by diluting the concentrated-type semiconductor treatment composition, or based on 100 parts by mass of the non-dilution-type semiconductor treatment composition (treatment agent). When the content of the compound A is within the above range, the pH of the treatment agent can be changed to weaken the affinity of the organic residue and the wafer (surface), thereby making the affinity of the treatment agent and the organic residue stronger. Therefore, it is possible to effectively remove the contaminants on the wafer.

1.3. Additional Component

The semiconductor treatment composition according to one embodiment of the invention may include a water-soluble polymer, an organic acid, an amine, and the like in addition to a liquid medium (i.e., main component).

1.3.1. Water-Soluble Polymer

The semiconductor treatment composition according to one embodiment of the invention may include a water-soluble polymer. The water-soluble polymer adheres to the treatment target surface, and reduces corrosion. Therefore, corrosion of the treatment target surface can be reduced by adding the water-soluble polymer to the semiconductor treatment composition. Note that the term "water-soluble" used herein in connection with a substance means that 0.1 g or more of the substance is dissolved in 100 g water at 20° C. The term "water-soluble polymer" used herein refers to a water-soluble compound in which two or more repeating units are bonded linearly or in a mesh-like manner through a covalent bond.

Examples of the water-soluble polymer include, but are not limited to, polyacrylic acid, polymethacrylic acid, polymaleic acid, polyvinylsulfonic acid, polyallylsulfonic acid, polystyrenesulfonic acid, and salts thereof; a copolymer of a monomer such as styrene, alpha-methylstyrene, or 4-methylstyrene, and an acid monomer such as (meth)acrylic acid or maleic acid, a polymer that includes a repeating unit including an aromatic hydrocarbon group obtained by condensing benzenesulfonic acid, naphthalenesulfonic acid, or the like using formalin, and salts thereof; a vinyl-based synthetic polymer such as polyvinyl alcohol, polyoxyethylene, polyvinylpyrrolidone, polyvinylpyridine, polyacrylamide, polyvinylformamide, polyethylenimine, polyvinyloxazoline, polyvinylimidazole, and polyallylamine; a modified natural polysaccharide such as hydroxyethyl cellulose, carboxymethyl cellulose, and modified starch; and the like. These water-soluble polymers may be used either alone or in combination.

The water-soluble polymer used in connection with one embodiment of the invention may be a homopolymer, or may be a copolymer obtained by copolymerizing two or more monomers. For example, a monomer that includes a carboxyl group, a monomer that includes a sulfonic acid group, a monomer that includes a hydroxyl group, a monomer that includes a polyethylene oxide chain, a monomer that includes an amino group, a monomer that includes a heterocyclic ring, and the like may be used as the monomers.

The weight average molecular weight (Mw) of the water-soluble polymer used in connection with one embodiment of the invention is preferably 1,000 to 1,500,000, and more preferably 3,000 to 1,200,000. Note that the term "weight average molecular weight" used herein refers to a polyethylene glycol-equivalent weight average molecular weight determined by gel permeation chromatography (GPC).

The viscosity of the semiconductor treatment composition at 25° C. is preferably less than 5 mPa·s, more preferably 4 mPa·s or less, further preferably 2 mPa·s or less, further more preferably 1.2 mPa·s or less, and particularly preferably 1 mPa·s or less. When the viscosity at 25° C. of the semiconductor treatment composition is within the above range, sufficient filtration rate can be obtained at the time of purifying the semiconductor treatment composition by filtration, thereby achieving enough throughput to be of practical use. In addition, when the viscosity at room temperature of the semiconductor treatment composition is within the above range, even in a case where irregularities remain on the polishing target surface, the composition enters the irregularities and can come in contact with the surfaces of the irregularities during the treatment step using the semiconductor treatment composition, so that the polishing target surface can be more uniformly treated. If the viscosity at 25° C. of the semiconductor treatment composition exceeds the above range, viscosity becomes too high, and thus the semiconductor treatment composition may hardly be supplied to the polishing target. Since the viscosity of the semiconductor treatment composition is substantially determined by the weight average molecular weight and the content of the water-soluble polymer to be added, the content of the water-soluble polymer may be adjusted taking account of the balance therebetween.

In this specification, the Ubbelohde viscosity measured according to JIS K2283 is used as the viscosity.

The content of the water-soluble polymer in the semiconductor treatment composition may be appropriately changed taking account of a metal wire material (e.g., copper and tungsten), an insulating material (e.g., silicon oxide), a barrier metal material (e.g., tantalum nitride and titanium nitride), and the like that are exposed on the surface of the treatment target that has been subjected to CMP, and the composition of the CMP slurry.

The content of the water-soluble polymer in the semiconductor treatment composition may also be appropriately changed taking account of the degree of dilution with respect to the concentrated-type semiconductor treatment composition. The lower limit of the content of the water-soluble polymer in the semiconductor treatment composition is preferably 0.001 parts by mass or more, and more preferably 0.01 parts by mass or more, based on 100 parts by mass of a treatment agent prepared by diluting the concentrated-type semiconductor treatment composition, or based on 100 parts by mass of the non-dilution-type semiconductor treatment composition (treatment agent). The upper limit of the content of the water-soluble polymer in the semiconductor treatment composition is preferably 1 part by mass or less, and more preferably 0.1 parts by mass or less, based on 100 parts by mass of a treatment agent prepared by diluting the concentrated-type semiconductor treatment composition, or based on 100 parts by mass of the non-dilution-type semiconductor treatment composition (treatment agent). When the content of the water-soluble polymer is within the above range, it is possible to remove particles and metal impurities included in the CMP slurry from the wiring board while suppressing the occurrence of corrosion, and obtain a more excellently treated surface.

1.3.2. Organic Acid

The semiconductor treatment composition according to one embodiment of the invention may include an organic acid. It is preferable that the organic acid include one or more acidic groups (e.g., carboxy group and sulfo group). Note that the term "organic acid" used herein excludes the water-soluble polymer described above.

Specific examples of the organic acid include citric acid, maleic acid, malic acid, tartaric acid, oxalic acid, malonic acid, succinic acid, ethylenediaminetetraacetic acid, acrylic acid, methacrylic acid, benzoic acid, phenyllactic acid, hydroxyphenyllactic acid, phenylsuccinic acid, naphthalenesulfonic acid, salts thereof, and the like. These organic acids may be used either alone or in combination.

An amino acid may also be used as the organic acid. Examples of the amino acid include a compound represented by the following general formula (2), and the like:

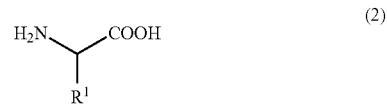

wherein $R^1$ is an atom or a group selected from the group consisting of a hydrogen atom, a hydrocarbon group having 1 to 10 carbon atoms, and an organic group having 1 to 20 carbon atoms that includes a hetero atom.

Examples of the hydrocarbon group having 1 to 10 carbon atoms that may be represented by $R^1$ in the general formula (2), include a saturated aliphatic hydrocarbon group having 1 to 10 carbon atoms, a saturated cyclic hydrocarbon group having 1 to 10 carbon atoms, an aromatic hydrocarbon group having 6 to 10 carbon atoms, and the like. Among these, a saturated aliphatic hydrocarbon group having 1 to 10 carbon atoms is preferable.

Examples of the organic group having 1 to 20 carbon atoms that includes a hetero atom that may be represented by $R^1$ in the general formula (2), include a hydrocarbon group having 1 to 20 carbon atoms that includes a carboxy group, a hydrocarbon group having 1 to 20 carbon atoms that includes a hydroxy group, a hydrocarbon group having 1 to 20 carbon atoms that includes an amino group, a hydrocarbon group having 1 to 20 carbon atoms that includes a mercapto group, an organic group having 1 to 20 carbon atoms that includes a heterocyclic ring, and the like. These groups may further include a hetero atom such as an oxygen atom, a sulfur atom, and a halogen atom, and may be substituted with an additional substituent.

Examples of the compound represented by the general formula (2) include alanine, arginine, asparagine, aspartic acid, cysteine, glutamine, glutamic acid, glycine, isoleucine, leucine, lysine, methionine, phenylalanine, serine, threonine, tyrosine, valine, tryptophan, histidine, 2-amino-3-aminopropanoic acid, and the like. These amino acids may be used either alone or in combination.

It is also preferable to use a compound represented by the following general formula (3) as the organic acid:

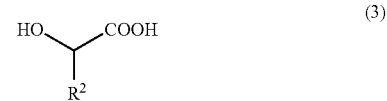

wherein $R^2$ is an organic group having 1 to 20 carbon atoms.

Examples of the organic group having 1 to 20 carbon atoms that is represented by $R^2$ in the general formula (3), include a saturated aliphatic hydrocarbon group having 6 to 20 carbon atoms, an unsaturated aliphatic hydrocarbon group having 6 to 20 carbon atoms, an organic group having 6 to 20 carbon atoms that includes a saturated cyclic hydrocarbon group, an organic group having 6 to 20 carbon atoms that includes an unsaturated cyclic hydrocarbon group, a hydrocarbon group having 1 to 20 carbon atoms that includes a carboxy group, a hydrocarbon group having 1 to 20 carbon atoms that includes a hydroxy group, a hydrocarbon group having 1 to 20 carbon atoms that includes an amino group, an organic group having 1 to 20 carbon atoms that includes a heterocyclic ring, and the like. Among these, an organic group having 6 to 20 carbon atoms that includes an unsaturated cyclic hydrocarbon group, and a hydrocarbon group having 1 to 20 carbon atoms that includes a carboxy group, are preferable, and an organic group having 6 to 20 carbon atoms that includes an aryl group, and a carboxymethyl group are particularly preferable. Note that the compound represented by the general formula (3) excludes the compound represented by the general formula (2).

Specific examples of the compound represented by the general formula (3) include hydroxyphenyllactic acid, hydroxymalonic acid, and the like. Among these, hydroxyphenyllactic acid is preferable. These compounds may be used either alone or in combination.

The content of the organic acid in the semiconductor treatment composition may be appropriately changed taking account of a metal wire material (e.g., copper and tungsten), an insulating material (e.g., silicon oxide), a barrier metal material (e.g., tantalum nitride and titanium nitride), and the like that are exposed on the surface of the treatment target that has been subjected to CMP, and the composition of the CMP slurry.

The content of the organic acid in the semiconductor treatment composition may also be appropriately changed taking account of the degree of dilution with respect to the concentrated-type semiconductor treatment composition. The lower limit of the content of the organic acid in the semiconductor treatment composition is preferably 0.0001 parts by mass or more, and more preferably 0.0005 parts by mass or more, based on 100 parts by mass of a treatment agent prepared by diluting the concentrated-type semiconductor treatment composition, or based on 100 parts by mass of the non-dilution-type semiconductor treatment composition (treatment agent). The upper limit of the content of the organic acid in the semiconductor treatment composition is preferably 1 part by mass or less, and more preferably 0.5 parts by mass or less, based on 100 parts by mass of a treatment agent prepared by diluting the concentrated-type semiconductor treatment composition, or based on 100 parts by mass of the non-dilution-type semiconductor treatment composition (treatment agent). When the content of the organic acid is within the above range, it is possible to effectively remove impurities that adhere to the surface of the wiring material. It is also possible to more effectively suppress a situation in which etching proceeds to an excessive extent, and obtain an excellently treated surface.

1.3.3. Amine

The semiconductor treatment composition according to one embodiment of the invention may include an amine (excluding an amino acid). It is considered that an amine functions as an etchant. It is considered that the addition of an amine makes it possible to etch and remove a metal oxide film (e.g., CuO layer, $Cu_2O$ layer, and $Cu(OH)_2$ layer) and an organic residue (e.g., BTA layer) on the wiring board in the treatment step that is performed after completion of CMP.

It is preferable that the amine be a water-soluble amine. The term "water-soluble" used herein in connection with an amine means that 0.1 g or more of the amine is dissolved in 100 g water at 20° C. Examples of the amine include an alkanolamine, a primary amine, a secondary amine, a tertiary amine, and the like.

Examples of the alkanolamine include monoethanolamine, diethanolamine, triethanolamine, N-methylethanolamine, N-methyl-N,N-diethanolamine, N,N-dimethylethanolamine, N,N-diethylethanolamine, N,N-dibutylethanolamine, N-(beta-aminoethyl)ethanolamine, N-ethylethanolamine, monopropanolamine, dipropanolamine, tripropanolamine, monoisopropanolamine, diisopropanolamine, triisopropanolamine, and the like. Examples of the primary amine include methylamine, ethylamine, propylamine, butylamine, pentylamine, 1,3-propanediamine, and the like. Examples of the secondary amine include piperidine, piperazine, and the like. Examples of the tertiary amine include trimethylamine, triethylamine, and the like. These amines may be used either alone or in combination.

Among these, monoethanolamine and monoisopropanolamine are preferable, and monoethanolamine is more preferable, since it is possible to effectively etch a metal oxide film and an organic residue on the wiring board.

The content of the amine in the semiconductor treatment composition may be appropriately changed taking account of a metal wire material (e.g., copper and tungsten), an insulating material (e.g., silicon oxide), a barrier metal material (e.g., tantalum nitride and titanium nitride), and the like that are exposed on the surface of the treatment target that has been subjected to CMP, and the composition of the CMP slurry.

The content of the amine in the semiconductor treatment composition may also be appropriately changed taking account of the degree of dilution with respect to the concentrated-type semiconductor treatment composition. The lower limit of the content of the amine in the semiconductor treatment composition is preferably 0.0001 parts by mass or more, and more preferably 0.0005 parts by mass or more, based on 100 parts by mass of a treatment agent prepared by diluting the concentrated-type semiconductor treatment composition, or based on 100 parts by mass of the non-dilution-type semiconductor treatment composition (treatment agent). The upper limit of the content of the amine in the semiconductor treatment composition is preferably 1 part by mass or less, and more preferably 0.5 parts by mass or less, based on 100 parts by mass of a treatment agent prepared by diluting the concentrated-type semiconductor treatment composition, or based on 100 parts by mass of the non-dilution-type semiconductor treatment composition (treatment agent). When the content of the amine is within the above range, it is possible to effectively etch and remove a metal oxide film and an organic residue on the wiring board in the cleaning step that is performed after completion of CMP.

1.3.4. Liquid Medium

The semiconductor treatment composition according to one embodiment of the invention is a liquid that includes a liquid medium as the main component. The liquid medium may be appropriately selected taking account of the intended use (e.g., cleaning, etching, and resist removal) of the treatment target. For example, when the semiconductor treatment composition is used as a cleaning agent, it is preferable that the liquid medium include water as the main component, and function as a solvent. Examples of such a liquid medium include water, a mixed medium that includes water and an alcohol, a mixed medium that includes water and a water-miscible organic solvent, and the like. It is preferable to use water or a mixed medium that includes water and an alcohol. It is more preferable to use water.

For example, when the semiconductor treatment composition is used as an etchant or a resist stripper, it is preferable that the liquid medium include an organic solvent as the main component, and function as a solvent. Examples of the organic solvent include a known organic solvent that can be used for a semiconductor treatment, such as a polar solvent, e.g., a ketone-based solvent, an ester-based solvent, an ether-based solvent, and an amide-based solvent, and a hydrocarbon-based solvent.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylene carbonate, gamma-butyrolactone, and the like.

Examples of the ester-based solvent include a linear ester-based solvent such as methyl acetate, butyl acetate, ethyl acetate, isopropyl acetate, pentyl acetate, isopentyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl carbonate, propyl carbonate, butyl carbonate, methyl pyruvate, ethyl pyruvate, propyl pyruvate, butyl pyruvate, methyl acetoacetoate, ethyl acetoacetate, methyl propionate, ethyl propionate, propyl propionate, isopropyl propionate, methyl 3-methoxypropionate, ethyl 3-methoxypropionate, ethyl 3-ethoxypropionate, and propyl 3-methoxypropionate; a cyclic ester-based solvent such as a lactone (e.g., gamma-butyrolactone); and the like.

Examples of the ether-based solvent include a glycol ether-based solvent such as ethylene glycol dibutyl ether, propylene glycol dimethyl ether, propylene glycol diethyl ether, diethylene glycol dimethyl ether, diethylene glycol diethyl ether, and diethylene glycol dibutyl ether; diisopentyl ether, diisobutyl ether, dioxane, tetrahydrofuran, anisole, perfluoro-2-butyltetrahydrofuran, perfluorotetrahydrofuran, 1,4-dioxane, and the like.

Examples of the amide-based solvent include N-methyl-2-pyrrolidone, N,N-dimethylacetamide, N,N-dimethylformamide, hexamethylphosphoric triamide, 1,3-dimethyl-2-imidazolidinone, and the like. Examples of a further polar solvent include dimethyl sulfoxide and the like.

Examples of the hydrocarbon-based solvent include an aliphatic hydrocarbon-based solvent such as pentane, hexane, octane, decane, 2,2,4-trimethylpentane, 2,2,3-trimethylhexane, perfluorohexane, perfluoroheptane, limonene, and pinene; and an aromatic hydrocarbon-based solvent such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, and dipropylbenzene.

1.3.5. Further Additional Component

The semiconductor treatment composition according to one embodiment of the invention may appropriately (optionally) further include a pH-adjusting agent, a surfactant, and the like.

<pH-Adjusting Agent>

When the semiconductor treatment composition is used to treat the treatment target surface that includes copper as a wiring material, the lower limit of the pH of the semiconductor treatment composition is preferably 9 or more, and more preferably 10 or more, and the upper limit of the pH of the semiconductor treatment composition is preferably 14 or less. When the semiconductor treatment composition is used to treat the treatment target surface that includes tungsten as a wiring material, the upper limit of the pH of the semiconductor treatment composition is preferably 7 or less, and more preferably 6 or less, and the lower limit of the pH of the semiconductor treatment composition is preferably 2 or more.

When the pH of the semiconductor treatment composition cannot be adjusted to the desired value by adding the organic acid and the amine mentioned above, a pH-adjusting agent may be added to the semiconductor treatment composition in order to adjust the pH of the semiconductor treatment composition within the above range.

Examples of the pH-adjusting agent include an alkali metal hydroxide such as sodium hydroxide, potassium hydroxide, rubidium hydroxide, and cesium hydroxide, and a basic compound such as ammonia. These pH-adjusting agents may be used either alone or in combination.

<Surfactant>

A known component may be used as the surfactant. It is preferable to use a nonionic surfactant or an anionic surfactant as the surfactant. The addition of the surfactant may improve the effect of removing particles and metal impurities included in the CMP slurry from the wiring board, and a more excellently treated surface may be obtained.

Examples of the nonionic surfactant include a polyoxyethylene alkyl ether such as polyoxyethylene lauryl ether, polyoxyethylene cetyl ether, polyoxyethylene stearyl ether, and polyoxyethylene oleyl ether; a polyoxyethylene aryl ether such as polyoxyethylene octyl phenyl ether and polyoxyethylene nonyl phenyl ether; a sorbitan fatty acid ester such as sorbitan monolaurate, sorbitan monopalmitate, and sorbitan monostearate; a polyoxyethylene sorbitan fatty acid ester such as polyoxyethylene sorbitan monolaurate, polyoxyethylene sorbitan monopalmitate, and polyoxyethylene sorbitan monostearate; and the like. These nonionic surfactants may be used either alone or in combination.

Examples of the anionic surfactant include an alkylbenzenesulfonic acid such as dodecylbenzenesulfonic acid; an alkylnaphthalenesulfonic acid; an alkyl sulfate such as lauryl sulfate; a sulfuric acid ester of a polyoxyethylene alkyl ether, such as polyoxyethylene lauryl sulfate; a naphthalenesulfonic acid condensate; an alkyliminodicarboxylic acid; lignin sulfonic acid; and the like. These anionic surfactants may be used in the form of a salt. Examples of the counter cation include a sodium ion, a potassium ion, an ammonium ion, and the like. Among these, an ammonium ion is preferable from the viewpoint of preventing an excessive increase in potassium or sodium content.

When subjecting a treatment target (polishing target) that includes tungsten as a wiring material to CMP, a CMP slurry that includes an iron ion and a peroxide (e.g., hydrogen peroxide and potassium iodate) is used. Since the iron ion included in the CMP slurry is easily adsorbed on the surface of the treatment target (polishing target), the polishing target surface is easily contaminated with iron. In this case, since the iron ion is positively charged, it may be possible to effectively remove iron from the polished surface by adding the anionic surfactant to the semiconductor treatment composition.

The content of the surfactant in the semiconductor treatment composition may be appropriately changed taking account of a metal wire material (e.g., copper and tungsten), an insulating material (e.g., silicon oxide), a barrier metal material (e.g., tantalum nitride and titanium nitride), and the like that are exposed on the surface of the treatment target that has been subjected to CMP, and the composition of the CMP slurry.

The content of the surfactant in the semiconductor treatment composition may also be appropriately changed taking account of the degree of dilution with respect to the concentrated-type semiconductor treatment composition. The content of the surfactant in the semiconductor treatment composition is preferably 0.001 to 1 part by mass based on 100 parts by mass of a treatment agent prepared by diluting the concentrated-type semiconductor treatment composition, or based on 100 parts by mass of the non-dilution-type semiconductor treatment composition (treatment agent). When the content of the surfactant is within the above range, it is possible to effectively remove an organic residue in the treatment step that is performed after completion of CMP while reducing corrosion of the treatment target.

1.3. Method for Preparing Semiconductor Treatment Composition

The semiconductor treatment composition may be prepared using a known method (arbitrary method). The semiconductor treatment composition may be prepared by dissolving each component in the liquid medium (e.g., water or organic solvent), and filtering the solution. The components may be mixed in an arbitrary order using an arbitrary method.

When preparing the semiconductor treatment composition according to one embodiment of the invention, it is preferable to control the amount of particles by filtering the solution using a depth-type filter or a pleat-type filter. The term "depth-type filter" used herein refers to a high-performance filter that is also referred to as "depth filtration filter" or "volume filtration filter". The depth-type filter may have a stacked structure that is formed by stacking filtration membranes in which a number of pores are formed, or may be formed by rolling up a fiber bundle, for example. Specific examples of the depth-type filter include Profile II, Nexis NXA, Nexis NXT, Poly-Fine XLD, and Ultipleat Profile (manufactured by Pall Corporation); Depth Cartridge Filter and Wound Cartridge Filter (manufactured by Advantec Co., Ltd.); CP Filter and BM Filter (manufactured by Chisso Corporation); SLOPE-PURE, DIA, and MICRO-CILIA (manufactured by Roki Techno Co., Ltd.); and the like.

Examples of the pleat-type filter include a tubular high-performance filter that is obtained by pleating a microfiltration membrane sheet formed of a nonwoven fabric, filter paper, metal mesh, or the like, forming the microfiltration membrane sheet to have a tubular shape, liquid-tightly sealing the joint of the sheet, and liquid-tightly sealing each end of the tubular sheet. Specific examples of the pleat-type filter include HDC II and Poly-Fine II (manufactured by Pall Corporation); PP Pleated Cartridge Filter (manufactured by Advantec Co., Ltd.); POROUSFINE (manufactured by Chisso Corporation); CERTAIN-PORE and MICRO-PURE (manufactured by Roki Techno Co., Ltd.); and the like.

It is preferable to use a filter having a nominal filtration rating of 0.01 to 20 micrometers. When the nominal filtration rating is within the above range, it is possible to efficiently obtain a filtrate in which the number (per mL) of particles having a particle size of 20 micrometers or more measured using a particle counter is 0. Moreover, since the number of large particles trapped by the filter is minimized, the service life of the filter increases.

2. TREATMENT AGENT

The term "treatment agent" used herein refers to a liquid agent that is prepared by diluting the concentrated-type semiconductor treatment composition with a liquid medium, or prepared using the non-dilution-type semiconductor treatment composition, and is used to treat the treatment target surface. The concentrated-type semiconductor treatment composition is normally a composition in which each component is concentrated. Each user prepares the treatment agent by appropriately diluting the concentrated-type semiconductor treatment composition with a liquid medium, or utilizes the non-dilution-type semiconductor treatment composition directly as the treatment agent, and uses the treatment agent as a cleaning agent, an etchant, or a resist stripper.

The liquid medium that is used to dilute the concentrated-type semiconductor treatment composition is the same as the liquid medium that is included in the semiconductor treatment composition, and may be appropriately selected from the liquid media mentioned above taking account of the type of treatment agent.

The concentrated-type semiconductor treatment composition may be diluted with the liquid medium using a method that mixes the concentrated-type semiconductor treatment composition supplied from a pipe that supplies the concentrated-type semiconductor treatment composition, and the liquid medium supplied from a pipe that supplies the liquid medium, and supplies the mixture (treatment agent) to the treatment target surface. The concentrated-type semiconductor treatment composition and the liquid medium may be mixed using an ordinary method such as a method that causes the concentrated-type semiconductor treatment composition and the liquid medium to collide (be mixed) with each other through a narrow passage in a state in which pressure is applied; a method that causes the flow of the liquid to be repeatedly divided and joined by charging the pipe with a packing material such as glass tubes; and a method that provides a power-driven blade inside the pipe.

The concentrated-type semiconductor treatment composition may be diluted with the liquid medium using a method that provides a pipe that supplies the concentrated-type semiconductor treatment composition and a pipe that supplies the liquid medium so as to be independent of each other, and supplies a predetermined amount of liquid to the treatment target surface from each pipe so that the concentrated-type semiconductor treatment composition and the liquid medium are mixed on the treatment target surface. The concentrated-type semiconductor treatment composition may also be diluted with the liquid medium using a method that charges a container with a predetermined amount of concentrated-type semiconductor treatment composition and a predetermined amount of liquid medium, mixes the concentrated-type semiconductor treatment composition and the liquid medium, and supplies the mixture (treatment agent) to the treatment target surface.

Regarding the dilution ratio employed when diluting the concentrated-type semiconductor treatment composition with the liquid medium, it is preferable to dilute 1 part by mass of the concentrated-type semiconductor treatment composition with the liquid medium so that 1 to 500 parts by mass (1 to 500-fold amount), more preferably 20 to 500 parts by mass (20 to 500-fold amount), and particularly preferably 30 to 300 parts by mass (30 to 300-fold amount), of a mixture is obtained. Note that it is preferable to dilute the concentrated-type semiconductor treatment composition with the same liquid medium as that included in the concentrated-type semiconductor treatment composition. When the semiconductor treatment composition is concentrated, it is possible to transport and store the semiconductor treatment composition using a small container as compared with the case where the treatment agent prepared using the semiconductor treatment composition is transported and stored. This makes it possible to reduce the transport-storage cost. Since the purification volume is reduced as compared with the case where the treatment agent is purified by filtration or the like, it is possible to reduce the purification time, and implement mass production.

3. TREATMENT METHOD

A treatment method according to one embodiment of the invention includes treating a wiring board using the semiconductor treatment composition (i.e., treatment agent (e.g., cleaning agent, etchant, or resist stripper)), the wiring board including a wiring material and a barrier metal material, the wiring material being copper or tungsten, and the barrier metal material being at least one material selected from the group consisting of tantalum, titanium, cobalt, ruthenium, manganese, and compounds thereof. An example of the treatment method is described in detail below with reference to the drawings.

<Production of Wiring Board>

FIG. 1 is a cross-sectional view schematically illustrating a process that produces the wiring board that is used in connection with the treatment method. The wiring board is produced as described below.

FIG. 1 is a cross-sectional view schematically illustrating the polishing target that is to be subjected to CMP. As illustrated in FIG. 1, a polishing target 100 includes a substrate 10. The substrate 10 may include a silicon substrate, and a silicon oxide film that is formed on the silicon substrate, for example. A functional device such as a transistor (not illustrated in FIG. 1) may be formed on the substrate 10.

The polishing target 100 includes an insulating film 12 which is formed on the substrate 10 and in which a wiring recess 20 is formed, a barrier metal film 14 that is formed to cover the surface of the insulating film 12 and the bottom and the inner wall surface of the wiring recess 20, and a metal film 16 that is formed on the barrier metal film 14 so that the wiring recess 20 is filled with the metal film 16, the insulating film 12, the barrier metal film 14, and the metal film 16 being sequentially stacked.

The insulating film 12 may be a silicon oxide film formed by a vacuum process (e.g., a plasma enhanced-TEOS film (PETEOS film), a high-density plasma enhanced-TEOS film (HDP film), or a silicon oxide film obtained by thermal chemical vapor deposition), an insulating film referred to as fluorine-doped silicate glass (FSG), a borophosphosilicate film (BPSG film), an insulating film referred to as silicon oxynitride (SiON), silicon nitride, or the like.

Examples of a metal that is used to form the barrier metal film 14 include tantalum, titanium, cobalt, ruthenium, manganese, compounds thereof, and the like. The barrier metal film 14 is normally formed using one material among these material. Note that the barrier metal film 14 may be formed using two or more materials (e.g., tantalum and tantalum nitride) among these materials.

As illustrated in FIG. 1, the wiring recess 20 must be completely filled with the metal film 16. Therefore, a metal film having a thickness of 10,000 to 15,000 angstroms is normally deposited by chemical vapor deposition or electroplating. Examples of a material that is used to form the metal film 16 include copper and tungsten. When using copper, copper having high purity, or a copper alloy may be used. The copper content in the copper alloy is preferably 95 mass % or more.

The metal film 16 included in the polishing target 100 illustrated in FIG. 1 is subjected to CMP (polished) at a high speed in an area other than the area situated within the wiring recess 20 until the barrier metal film 14 is exposed (first polishing step). The exposed barrier metal film 14 is subjected to CMP (polished) (second polishing step). A wiring board 200 illustrated in FIG. 2 is thus obtained.

<Treatment of Wiring Board>

Figure 2:
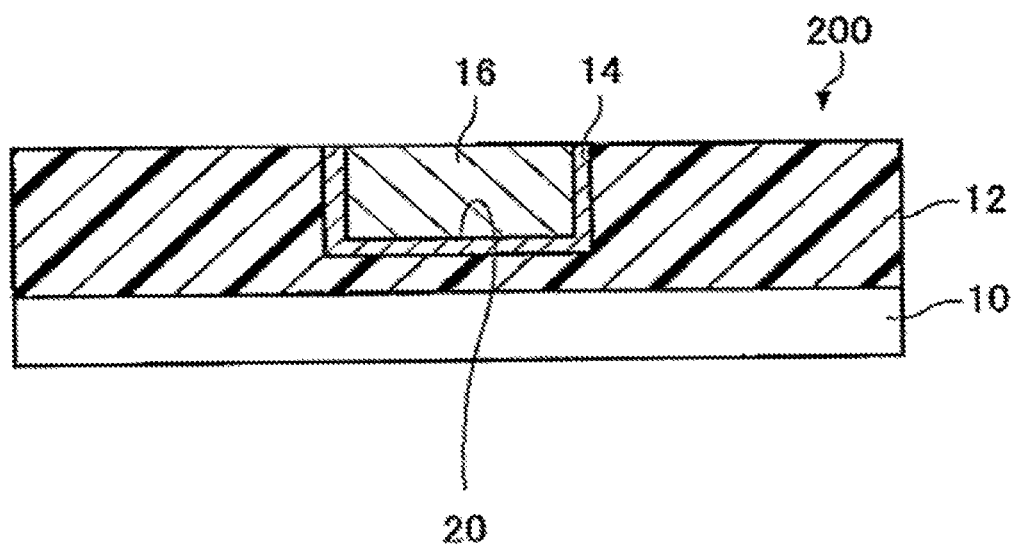
FIG. 2 is a cross-sectional view schematically illustrating a process that produces a wiring board that is used in connection with a treatment method according to one embodiment of the invention.

The surface (treatment target surface) of the wiring board 200 illustrated in FIG. 2 is treated using the treatment agent (cleaning agent). The treatment method can suppress corrosion of the wiring material and the barrier metal material, and efficiently remove an oxide film and an organic residue on the wiring board when treating the wiring board which has been subjected to CMP, and on which the wiring material and the barrier metal material are present.

It is very effective to perform the treatment method when the wiring board includes tungsten as the wiring material, and has been subjected to CMP using a composition (Fenton's reagent) that includes an iron ion and a peroxide (see JP-A-H10-265766). When subjecting the polishing target that includes tungsten as the wiring material to CMP, a CMP slurry that includes an iron ion and a peroxide (e.g., hydrogen peroxide and potassium iodate) is used. Since the iron ion included in the CMP slurry is easily adsorbed on the surface of the treatment target (polishing target), the polishing target surface is easily contaminated with iron. Iron can be removed by treating the polished surface using diluted hydrofluoric acid. In this case, however, the polished surface is easily etched and damaged. On the other hand, the semiconductor treatment composition includes potassium and sodium in a predetermined ratio, and production of a soluble salt (e.g., potassium tungstate and sodium tungstate) is promoted during the treatment step. This makes it possible to reduce contamination of the wiring board with a metal, and efficiently remove a polishing residue while reducing damage applied to the treatment target.

The treatment method is implemented by bringing the cleaning agent into direct contact with the wiring board 200, for example. The cleaning agent may be brought into direct contact with the wiring board 200 using a dipping method that fills a cleaning tank with the cleaning agent, and immerses the wiring board in the cleaning agent; a spin method that rotates the wiring board at a high speed while supplying the cleaning agent to the wiring board from a nozzle; a spray method that sprays the cleaning agent onto the wiring board; or the like. Examples of a device used to implement such a method include a batch-type treatment device that simultaneously treats a plurality of wiring boards placed in a cassette, a single-wafer treatment device that treats a single wiring board that is held by a holder, and the like.

When implementing the treatment method, the cleaning agent is normally used at room temperature. Note that the cleaning agent may be heated as long as the performance of the cleaning agent is not impaired. For example, the cleaning agent may be heated to about 40° C. to about 70° C.

It is also preferable to use a treatment method that utilizes a physical force in combination with the method that brings the cleaning agent into direct contact with the wiring board 200. This makes it possible to more effectively remove contamination due to particles that adhere to the wiring board 200, and reduce the treatment time. Examples of the treatment method that utilizes a physical force include a scrubbing cleaning method that utilizes a cleaning brush, and an ultrasonic cleaning method.

A cleaning step that utilizes ultrapure water or purified water may be performed before and/or after the cleaning step that utilizes the treatment method.

4. EXAMPLES

The invention is further described below by way of examples. Note that the invention is not limited to the following examples. The units "parts" and "%" used in connection with the examples respectively refer to "parts by mass" and "mass %" unless otherwise indicated.

4.1. Example 1

4.1.1. Preparation of Semiconductor Treatment Composition (Concentrated-Type Semiconductor Treatment Composition)

A polyethylene container was charged with each component listed in Table 1 in the ratio listed in Table 1. After the addition of a proper quantity of ion-exchanged water, the mixture was stirred for 15 minutes. Ion-exchanged water, potassium hydroxide, and sodium hydroxide were optionally added to the mixture so that the total amount of the components was 100 parts by mass to prepare a composition having the pH, the K content, and the Na content listed in Table 1.

Figure 3:
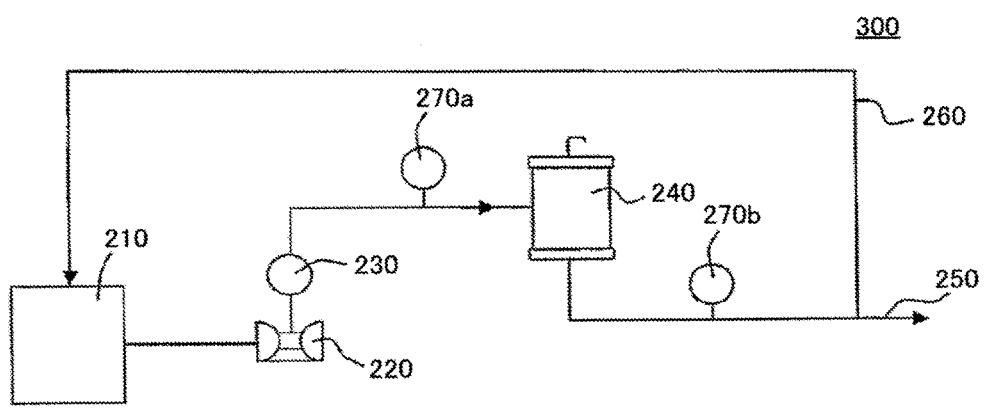
FIG. 3 schematically illustrates the configuration of the filtration device used in connection with the examples.

After the addition of 0.01 parts by mass of colloidal silica ("PL-1" manufactured by Fuso Chemical Co., Ltd., primary particle size: 15 nm) to 100 parts by mass of the composition, the mixture was filtered using the filtration device 300 illustrated in FIG. 3 (filtration step). The filtration device 300 illustrated in FIG. 3 includes a supply tank 210 that stores and supplies the composition from which foreign matter has not been removed, a constant volume pump 220 that discharges the composition (from which foreign matter has not been removed) at a constant flow rate, a filter 240 that includes a cartridge filter (not illustrated in FIG. 3) and a housing that holds (is fitted with) the cartridge filter, a pulsation protector 230 that is situated between the constant volume pump 220 and the filter 240, a first manometer 270a that is disposed between the pulsation protector 230 and the filter 240, and a second manometer 270b that is disposed on the downstream side of the filter 240. The filtration device 300 also includes a return conduit 260 that returns the semiconductor treatment composition from the filter 240 to the supply tank 210, and a discharge conduit 250 that discharges the semiconductor treatment composition that has been filtered through the filter 240.

In Example 1, a filter in which a membrane-type cartridge filter "WATER-FINE" (manufactured by Pall Corporation, nominal filtration rating: 0.05 micrometers, length: 10 inches) was provided in a housing, was used as the filter 240. An air-driven diaphragm pump was used as the constant volume pump 220. The differential pressure across the filter was set to 0.2 to 0.3 MPaG, and the flow rate of the composition was set to 50 L/min.

The composition was sampled on a timely basis, and filtration was stopped when the number of particles having a particle size of 0.1 to 0.3 micrometers included in the composition had reached the value (concentration) listed in Table 1 to obtain a semiconductor treatment composition (concentrated-type semiconductor treatment composition) of Example 1. Note that the number of particles per mL of the composition was measured as described below.

A liquid-borne particle sensor "KS-42AF" (manufactured by RION Co., Ltd.) was used as a particle counter. Blank measurement was repeated using ultrapure water until the number of particles measured became "30 per mL (0.1 micrometers)" (i.e., the number of particles having a particle size of more than 0.1 micrometers was 30 or less per mL). 100 mL of the concentrated-type semiconductor treatment composition (sample) was provided, and placed in a syringe sampler "KZ-31W". The number of particles having a particle size of 0.1 to 0.3 micrometers per mL of the sample was measured twice using the liquid-borne particle sensor, and the average value thereof was calculated. The average value was taken as the number of particles having a particle size of 0.1 to 0.3 micrometers per mL of the semiconductor treatment composition.

The viscosity of the semiconductor treatment composition was measured according to JIS K2283 by maintaining the solution temperature of the obtained semiconductor treatment composition (concentrated-type semiconductor treatment composition) at 25° C. in the glass tube for measuring Ubbelohde viscosity, measuring the time required for moving a predetermined distance, and multiplying a constant by the moving time.

4.1.2. Evaluation Tests

<Filterability Evaluation>

The filterability in production of a composition is considered as an index for determining the productivity of composition. When the filterability is evaluated as "Bad", the productivity of composition may deteriorate significantly and the composition may deteriorate due to contact with the atmosphere or heat generated by the motor used for filtration. Accordingly, the fast filtration flow rate is an index that the composition is determined to be good.

The filterability evaluation is performed by filtering the semiconductor treatment composition using a membrane filter such as a 10-inch Varafine VFSG (nominal filtration rating: 0.05 micrometers)(manufactured by Pall Corporation) which is mounted to a filter housing connected to the magnetic pump MD-F (manufactured by IWAKI Co., Ltd). The results are listed in Table 1. The following evaluation standard was used.

(Evaluation Standard)

The semiconductor treatment composition passed through the filter was collected for one minute and the weight thereof was measured. The filtration flow rate was calculated from the obtained filtration weight and the specific gravity. A case where the obtained filtration flow rate is 5 L/min or higher was evaluated as "Very good", a case where the obtained filtration flow rate is 1 L/min or higher and less than 5 L/min was evaluated as "Good" (acceptable in practical use), and a case where the obtained filtration flow rate is less than 1 L/min was evaluated as "Bad" (unacceptable).

<Foaming Evaluation>

When the semiconductor treatment composition foams in the treatment step, the foaming becomes a false defect on the surface of the substrate, whereby the treatment efficiency deteriorates significantly, for example, the number of particles is increased reversely. Accordingly, when the foaming is small, it is an index that the semiconductor treatment composition is determined to be good.

A small amount of the semiconductor treatment composition was put in a plastic measuring cylinder having a capacity of 1000 mL (inner diameter of 6.2 cm) to sufficiently make the wall surface thereof wet. And then, 100 mL of the semiconductor treatment composition was put into the measuring cylinder so as not to foam. On the other hand, 100 mL of the same semiconductor treatment composition is put into an exclusive burette so as not to foam. The burette was fixed such that the tip of the burette was located at the height of 70 cm over the liquid level in the measuring cylinder. The cock of the burette was fully opened and the semiconductor treatment composition was dropped into the center of the liquid level in the measuring cylinder. The cock was closed at the time of completing dropping of 100 mL of the semiconductor treatment composition, and the height of foaming from the liquid level was measured. The results are listed in Table 1. The following evaluation standard was used.

(Evaluation Standard)

A case where the height of foaming was less than 5 mm was evaluated as "Very good", a case where the height of foaming was equal to or more than 5 mm to less than 1 cm was evaluated as "Good" (acceptable), and a case where the height of foaming was 1 cm or more was evaluated as "Bad" (unacceptable).

<Watermark Evaluation>

A decrease in yield in semiconductor production is caused by the defects called "watermarks" occurred over the entire surface of the substrate that had been subjected to the treatment with the semiconductor treatment composition. Accordingly, when the number of watermarks is small as much as possible, it is an index that the semiconductor treatment composition is determined to be good.

The semiconductor treatment composition (concentrated-type semiconductor treatment composition) prepared as described above was diluted with ultrapure water (number of particles having a particle size of 0.3 micrometers or more: 10 or less per mL, pH: 6.5) in the dilution ratio listed in Table 1 to prepare a treatment agent (cleaning agent), and the surface of the silicon wafer that had been stacked with a silicon oxide film having a thickness of 20000 angstroms was treated (cleaned) on the platen using a chemical mechanical polishing device "AWAT Reflexion LK" (manufactured by Applied Materials, Inc.,) under the following conditions. A brush scrubbing treatment (cleaning) was then performed.

<Treatment (Cleaning) on Platen>
Treatment agent: treatment agent (cleaning agent) prepared as described above
Head rotational speed: 70 rpm
Head load: 100 g/cm$^2$
Platen rotational speed: 71 rpm
Treatment agent supply rate: 300 mL/min
Treatment time: 30 sec <Brush Scrubbing Treatment (Cleaning)>
Treatment agent: treatment agent (cleaning agent) prepared as described above
Upper brush rotational speed: 400 rpm
Lower brush rotational speed: 400 rpm
Substrate rotational speed: 50 rpm
Treatment agent supply rate: 1200 mL/min
Treatment time: 40 sec The surface of the substrate that had been subjected to treatment was then subjected to the defect inspection process using a wafer surface defects observation apparatus "KLA 2351" (manufactured by KLA Tencor Corp.), thereby inspecting the number of watermarks (defects) on the entire surface of the treatment target. The results are listed in Table 1. The following evaluation standard was used.

(Evaluation Standard)

A case where the number of watermarks over the entire surface of the substrate was 5 or less was evaluated as "Very good", a case where the number of watermarks over the entire surface of the substrate was more than 5 and 10 or less was evaluated as "Good" (acceptable), and a case where number of watermarks over the entire surface of the substrate was more than 10, was evaluated as "Bad" (unacceptable).

4.2. Examples 2 to 23 and Comparative Examples 1 to 5

The used semiconductor treatment composition was prepared in the same manner as in Example 1, except that the composition was changed as listed in Tables 1 to 2, and a treatment agent (cleaning agent) was prepared in the same manner as in Example 1, except that the composition was changed as listed in Tables 1 to 2. Various evaluation tests were performed in the same manner as in Example 1.

4.3. Example 24

4.3.1. Preparation of Semiconductor Treatment Composition (Non-Dilution-Type Semiconductor Treatment Composition)

A polyethylene container was charged with each component listed in Table 3 in the ratio listed in Table 3. After the optional addition of potassium hydroxide and sodium hydroxide so that the pH, the K content, and the Na content listed in Table 3 were obtained, the mixture was stirred for 15 minutes.

The resulting semiconductor treatment composition (non-dilution-type semiconductor treatment composition) was filtered in the same manner as in Example 1, except that a filter in which a membrane-type cartridge filter "PE-CLEAN" (manufactured by Pall Corporation, nominal filtration rating: 0.05 micrometers, length: 10 inches) was provided in a housing, was used as the filter 240. The composition was sampled on a timely basis, and filtration was stopped when the number of particles having a particle size of 0.1 to 0.3 micrometers included in the semiconductor treatment composition had reached the value (concentration) listed in Table 3 to obtain a semiconductor treatment composition (non-dilution-type semiconductor treatment composition) of Example 24. The evaluation tests were performed in the same manner as in Example 1, except that the semiconductor treatment composition was used directly as the treatment agent (etchant) as it is.

4.4. Example 25

A semiconductor treatment composition (non-dilution-type semiconductor treatment composition) was prepared in the same manner as in Example 24, except that the composition was changed as listed in Table 3, and used directly as a treatment agent (resist stripper) as it is. Various evaluation tests were performed in the same manner as in Example 24.

4.5. Examples 26 to 29 and Comparative Examples 6 to 9

A semiconductor treatment composition (non-dilution-type semiconductor treatment composition) was prepared in the same manner as in Example 24, except that the composition was changed as listed in Table 3, and used directly as a treatment agent (etchant or resist stripper) without being diluted. Various evaluation tests were performed in the same manner as in Example 24.

4.6. Evaluation Results

The composition of each semiconductor treatment composition and the evaluation results are listed in Tables 1 to 3.

TABLE 1

| | | | Example 1 | Example 2 | Example 3 | Example 4 | Example 5 | Example 6 | Example 7 |
|---|---|---|---|---|---|---|---|---|---|
| Semiconductor treatment composition (concentrated-type semiconductor treatment composition) | Compound A | TMAH | 0.01 | | | | | | |
| | | TEAH | | 0.02 | | | | | |
| | | TPAH | | | 0.01 | | | | 0.1 |
| | | TBAH | | | | 0.02 | | | |
| | | Choline | | | | | 0.01 | | |
| | | Ammonium hydroxide | | | | | | 0.2 | |
| | Water-soluble polymer | Polyacrylic acid (Mw = 700,000) | 0.5 | | | | | | |
| | | Polyacrylic acid (Mw = 55,000) | | 0.2 | | | | | |
| | | Polyacrylic acid (Mw = 6,000) | | | 0.05 | | | | |
| | | Polymaleic acid (Mw = 2,000) | | | | 0.1 | | | |
| | | Styrene-maleic acid copolymer | | | | | 0.2 | | |
| | | Styrene-maleic acid half ester copolymer | | | | | | 0.5 | |
| | | Naphthalenesulfonic acid-formalin condensate Na salt | | | | | | | 0.07 |
| | Organic acid | Serine | | | | | | | |
| | | Histidine | | | | | | | |
| | | Arginine | | | | | | | |
| | | Phenylalanine | | 1 | | | | | |
| | | Benzoic acid | | | 0.5 | | | | |
| | | Hydroxyphenyllactic acid | | | | | | | |
| | | Phenylsuccinic acid | | | | | | | |
| | | Naphthalenesulfonic acid | | | | | | | |
| | Amine | Monoethanolamine | | | | 1 | | | |
| | | Isopropanolamine | 3 | | | | 1 | | 1.5 |
| | K/Na content | $M_K$ (ppm) | $1.0 \times 10^1$ | $3.0 \times 10^0$ | $1.0 \times 10^1$ | $5.0 \times 10^0$ | $7.0 \times 10^1$ | $2.0 \times 10^0$ | $5.0 \times 10^0$ |
| | | $M_{Na}$ (ppm) | $1.8 \times 10^{-1}$ | $3.0 \times 10^{-2}$ | $1.5 \times 10^{-2}$ | $2.0 \times 10^{-1}$ | $2.0 \times 10^{-1}$ | $3.0 \times 10^{-2}$ | $1.2 \times 10^0$ |
| | | $M_K/M_{Na}$ | $5.6 \times 10^1$ | $1.0 \times 10^2$ | $6.7 \times 10^2$ | $2.5 \times 10^1$ | $3.5 \times 10^2$ | $6.7 \times 10^1$ | $4.2 \times 10^0$ |
| | Number of particles | Number of particles having particle size of 0.1 to 0.3 micrometers (per mL) | $8.8 \times 10^2$ | $1.4 \times 10^3$ | $5.0 \times 10^1$ | $3.0 \times 10^2$ | $2.3 \times 10^2$ | $8.5 \times 10^1$ | $1.4 \times 10^3$ |
| | Viscosity (mPa·s) | | 2.4 | 1.5 | 1.3 | 1.1 | 1.2 | 2.5 | 1.4 |
| | pH | | 13.1 | 12.4 | 11.5 | 12.4 | 12.4 | 12.4 | 12.5 |
| Production conditions | Dilution ratio | | 300 | 100 | 50 | 100 | 100 | 100 | 50 |
| Treatment agent | K/Na content | $M_K$ (ppm) | $3.3 \times 10^{-2}$ | $3.0 \times 10^{-2}$ | $2.0 \times 10^{-1}$ | $5.0 \times 10^{-2}$ | $7.0 \times 10^{-1}$ | $2.0 \times 10^{-2}$ | $1.0 \times 10^{-1}$ |
| | | $M_{Na}$ (ppm) | $6.0 \times 10^{-4}$ | $3.0 \times 10^{-4}$ | $3.0 \times 10^{-4}$ | $2.0 \times 10^{-3}$ | $2.0 \times 10^{-3}$ | $3.0 \times 10^{-4}$ | $2.4 \times 10^{-2}$ |
| | | $M_K/M_{Na}$ | $5.6 \times 10^1$ | $1.0 \times 10^2$ | $6.7 \times 10^2$ | $2.5 \times 10^1$ | $3.5 \times 10^2$ | $6.7 \times 10^1$ | $4.2 \times 10^0$ |
| | Number of particles | Number of particles having particle size of 0.1 to 0.3 micrometers (per mL) | $3.5 \times 10^1$ | $1.7 \times 10^2$ | $1.2 \times 10^1$ | $3.6 \times 10^1$ | $2.8 \times 10^1$ | $1.0 \times 10^1$ | $3.4 \times 10^2$ |
| | Viscosity (mPa·s) | | 1.2 | 1 | 1 | 1 | 1.2 | 1.2 | 1 |
| | pH | | 10.6 | 10.8 | 10.6 | 10.6 | 10.4 | 10.6 | 11.8 |
| Evaluation item | Type | | Cleaning | Cleaning | Cleaning | Cleaning | Cleaning | Cleaning | Cleaning |
| | Filterability evaluation | | Very good | Very good | Very good | Very good | Very good | Good | Very good |
| | Foaming evaluation | | Very good | Very good | Very good | Very good | Very good | Good | Very good |
| | Watermark evaluation | | Very good | Very good | Very good | Very good | Very good | Very good | Very good |

TABLE 1-continued

| | | | Example | | | | | | |
|---|---|---|---|---|---|---|---|---|---|
| | | | 8 | 9 | 10 | 11 | 12 | 13 | 14 |
| Semiconductor treatment composition (concentrated-type semiconductor treatment composition) | Compound A | TMAH | 0.2 | | | | | | |
| | | TEAH | | 0.1 | | | | | |
| | | TPAH | | | | | 0.1 | | |
| | | TBAH | | | | | | 0.2 | 0.1 |
| | | Choline | | | 0.2 | | | | |
| | | Ammonium hydroxide | | | | 0.1 | | | |
| | Water-soluble polymer | Polyacrylic acid (Mw = 700,000) | | 0.14 | | | | | |
| | | Polyacrylic acid (Mw = 55,000) | | | 0.2 | | | | |
| | | Polyacrylic acid (Mw = 6,000) | | | | 0.3 | | | |
| | | Polymaleic acid (Mw = 2,000) | | | | | 0.1 | | |
| | | Styrene-maleic acid copolymer | | | | | | 0.01 | |
| | | Styrene-maleic acid half ester copolymer | | | | | | | 0.07 |
| | | Naphthalenesulfonic acid-formalin condensate Na salt | 0.05 | | | | | | |
| | Organic acid | Serine | | | | | | | |
| | | Histidine | | 0.2 | | | | | |
| | | Arginine | | | 0.5 | | | | |
| | | Phenylalanine | | | | 0.3 | | | |
| | | Benzoic acid | | | | | 0.35 | | |
| | | Hydroxyphenyllactic acid | | | | | | 0.15 | |
| | | Phenylsuccinic acid | | | | | | | 0.3 |
| | | Naphthalenesulfonic acid | | | | | | | |
| | Amine | Monoethanolamine | | | | | | | |
| | | Isopropanolamine | | | | | | | |
| | K/Na content | $M_K$ (ppm) | $2.5 \times 10^1$ | $3.0 \times 10^0$ | $4.0 \times 10^1$ | $4.0 \times 10^0$ | $1.0 \times 10^2$ | $5.0 \times 10^1$ | $3.0 \times 10^2$ |
| | | $M_{Na}$ (ppm) | $2.8 \times 10^{-1}$ | $1.7 \times 10^0$ | $3.0 \times 10^{-2}$ | $2.8 \times 10^{-1}$ | $1.7 \times 10^0$ | $2.0 \times 10^{-3}$ | $5.0 \times 10^0$ |
| | | $M_K/M_{Na}$ | $8.9 \times 10^1$ | $1.8 \times 10^0$ | $1.3 \times 10^3$ | $1.4 \times 10^1$ | $5.9 \times 10^1$ | $2.5 \times 10^3$ | $6.0 \times 10^1$ |
| | Number of particles | Number of particles having particle size of 0.1 to 0.3 micrometers (per mL) | $1.4 \times 10^3$ | $1.2 \times 10^3$ | $9.5 \times 10^2$ | $1.2 \times 10^2$ | $6.0 \times 10^2$ | $1.5 \times 10^2$ | $1.2 \times 10^3$ |
| | Viscosity (mPa · s) | | 1.1 | 3.3 | 2.5 | 1.6 | 1.2 | 3 | 1.2 |
| | pH | | 13.1 | 13.8 | 13.8 | 13.8 | 13.8 | 13.4 | 13.9 |
| Production conditions | Dilution ratio | | 70 | 70 | 70 | 70 | 70 | 50 | 100 |
| Treatment agent | K/Na content | $M_K$ (ppm) | $3.6 \times 10^{-1}$ | $4.3 \times 10^{-2}$ | $5.7 \times 10^{-1}$ | $5.7 \times 10^{-2}$ | $1.4 \times 10^0$ | $1.0 \times 10^0$ | $3.0 \times 10^0$ |
| | | $M_{Na}$ (ppm) | $4.0 \times 10^{-3}$ | $2.4 \times 10^{-2}$ | $4.3 \times 10^{-4}$ | $4.0 \times 10^{-3}$ | $2.4 \times 10^{-2}$ | $4.0 \times 10^{-4}$ | $5.0 \times 10^{-2}$ |
| | | $M_K/M_{Na}$ | $8.9 \times 10^1$ | $1.8 \times 10^0$ | $1.3 \times 10^3$ | $1.4 \times 10^1$ | $5.9 \times 10^1$ | $2.5 \times 10^3$ | $6.0 \times 10^1$ |
| | Number of particles | Number of particles having particle size of 0.1 to 0.3 micrometers (per mL) | $2.4 \times 10^2$ | $2.1 \times 10^1$ | $1.6 \times 10^2$ | $2.1 \times 10^1$ | $1.0 \times 10^2$ | $3.6 \times 10^1$ | $1.4 \times 10^2$ |
| | Viscosity (mPa · s) | | 1 | 1.4 | 1.2 | 1 | 1 | 1.3 | 1 |
| | pH | | 11.8 | 11.7 | 11.5 | 11.7 | 11.7 | 11.6 | 11.7 |
| Evaluation item | Type | | Cleaning | Cleaning | Cleaning | Cleaning | Cleaning | Cleaning | Cleaning |
| | Filterability evaluation | | Very good | Good | Good | Very good | Very good | Good | Very good |
| | Foaming evaluation | | Very good | Good | Good | Very good | Very good | Good | Very good |
| | Watermark evaluation | | Very good | Very good | Very good | Very good | Very good | Very good | Very good |

TABLE 2

|  |  |  | Example | | | | |
|---|---|---|---|---|---|---|---|
|  |  |  | 15 | 16 | 17 | 18 | 19 |
| Semiconductor treatment composition (concentrated-type semiconductor treatment composition) | Compound A | TMAH |  |  | 0.2 |  |  |
|  |  | TEAH |  |  |  | 0.1 |  |
|  |  | TPAH |  |  |  |  |  |
|  |  | TBAH | 0.2 |  |  |  | 0.1 |
|  |  | Choline |  | 0.1 |  |  |  |
|  |  | Ammonium hydroxide |  |  |  |  |  |
|  | Water-soluble polymer | Polyacrylic acid (Mw = 700,000) | 0.1 |  |  | 0.03 |  |
|  |  | Polyacrylic acid (Mw = 55,000) |  | 0.03 |  |  |  |
|  |  | Polyacrylic acid (Mw = 6,000) |  |  | 0.1 |  |  |
|  |  | Polymaleic acid (Mw = 2,000) |  |  |  |  | 0.05 |
|  | Organic acid | Serine | 0.2 |  |  |  |  |
|  |  | Cysteine |  |  | 0.05 |  |  |
|  |  | N-Acetyl-L-cysteine |  | 0.01 |  | 0.05 |  |
|  |  | Histidine |  |  |  |  |  |
|  |  | Arginine |  |  |  |  |  |
|  |  | Phenylalanine |  |  |  |  | 0.1 |
|  | Amine | Monoethanolamine | 1 | 1 | 2 | 1 |  |
|  |  | Hydroxylamines |  |  |  |  | 1 |
|  | Other | KOH |  |  |  |  |  |
|  | K/Na content | $M_K$(ppm) | $5.0 \times 10^0$ | $4.0 \times 10^1$ | $3.0 \times 10^0$ | $1.0 \times 10^2$ | $1.0 \times 10^0$ |
|  |  | $M_{Na}$(ppm) | $3.0 \times 10^0$ | $1.0 \times 10^{-2}$ | $3.0 \times 10^0$ | $5.0 \times 10^{-2}$ | $1.5 \times 10^{-1}$ |
|  |  | $M_K/M_{Na}$ | $1.7 \times 10^0$ | $4.0 \times 10^3$ | $1.0 \times 10^0$ | $2.0 \times 10^3$ | $6.7 \times 10^0$ |
|  | Number of particles | Number of particles having particle size of 0.1 to 0.3 micrometers (per mL) | $1.4 \times 10^3$ | $5.3 \times 10^2$ | $8.1 \times 10^1$ | $1.9 \times 10^3$ | $1.5 \times 10^3$ |
|  | Viscosity (mPa · s) |  | 4.5 | 1.5 | 1.6 | 3.5 | 1.1 |
|  | pH |  | 13.5 | 13.4 | 12.6 | 13.6 | 13.8 |
| Production conditions | Dilution ratio |  | 100 | 100 | 100 | 70 | 80 |
| Treatment agent | K/Na content | $M_K$(ppm) | $5.0 \times 10^{-2}$ | $4.0 \times 10^{-1}$ | $3.0 \times 10^{-2}$ | $1.4 \times 10^0$ | $1.3 \times 10^{-2}$ |
|  |  | $M_{Na}$(ppm) | $3.0 \times 10^{-2}$ | $1.0 \times 10^{-4}$ | $3.0 \times 10^{-2}$ | $7.1 \times 10^{-4}$ | $1.9 \times 10^{-3}$ |
|  |  | $M_K/M_{Na}$ | $1.7 \times 10^0$ | $4.0 \times 10^3$ | $1.0 \times 10^0$ | $2.0 \times 10^3$ | $6.7 \times 10^0$ |
|  | Number of particles | Number of particles having particle size of 0.1 to 0.3 micrometers (per mL) | $1.7 \times 10^2$ | $6.4 \times 10^1$ | $9.7 \times 10^0$ | $3.3 \times 10^2$ | $2.3 \times 10^2$ |
|  | Viscosity (mPa · s) |  | 1.4 | 1 | 1 | 1.3 | 1 |
|  | pH |  | 11.8 | 11.5 | 10.8 | 12 | 11.5 |
|  | Type |  | Cleaning | Cleaning | Cleaning | Cleaning | Cleaning |
| Evaluation item | Filterability evaluation |  | Good | Very good | Very good | Good | Very good |
|  | Foaming evaluation |  | Good | Very good | Very good | Good | Very good |
|  | Watermark evaluation |  | Very good | Very good | Very good | Very good | Very good |

|  |  |  | Example | | | |
|---|---|---|---|---|---|---|
|  |  |  | 20 | 21 | 22 | 23 |
| Semiconductor treatment composition (concentrated-type semiconductor treatment composition) | Compound A | TMAH |  |  |  |  |
|  |  | TEAH |  |  |  |  |
|  |  | TPAH | 0.05 |  |  |  |
|  |  | TBAH |  |  |  |  |
|  |  | Choline |  |  | 0.05 |  |
|  |  | Ammonium hydroxide |  | 0.05 |  | 0.05 |
|  | Water-soluble polymer | Polyacrylic acid (Mw = 700,000) | 0.1 |  | 0.0001 |  |
|  |  | Polyacrylic acid (Mw = 55,000) |  |  |  | 0.001 |
|  |  | Polyacrylic acid (Mw = 6,000) |  | 0.01 |  |  |
|  |  | Polymaleic acid (Mw = 2,000) |  |  |  |  |
|  | Organic acid | Serine |  |  |  |  |
|  |  | Cysteine |  | 0.01 | 0.003 |  |
|  |  | N-Acetyl-L-cysteine |  |  |  | 0.001 |
|  |  | Histidine | 0.3 |  |  |  |
|  |  | Arginine |  |  |  |  |
|  |  | Phenylalanine |  |  |  |  |
|  | Amine | Monoethanolamine | 3 | 1 | 0.05 | 0.01 |
|  |  | Hydroxylamines |  |  |  |  |
|  | Other | KOH |  |  |  |  |
|  | K/Na content | $M_K$(ppm) | $1.0 \times 10^0$ | $3.0 \times 10^1$ | $1.0 \times 10^{-2}$ | $2.0 \times 10^{-3}$ |
|  |  | $M_{Na}$(ppm) | $1.0 \times 10^{-1}$ | $4.0 \times 10^{-1}$ | $7.0 \times 10^{-3}$ | $6.0 \times 10^{-3}$ |
|  |  | $M_K/M_{Na}$ | $1.0 \times 10^1$ | $7.5 \times 10^1$ | $1.4 \times 10^0$ | $3.3 \times 10^{-1}$ |
|  | Number of particles | Number of particles having particle size of 0.1 to 0.3 micrometers (per mL) | $1.1 \times 10^3$ | $5.0 \times 10^2$ | $9.0 \times 10^1$ | $2.0 \times 10^1$ |
|  | Viscosity (mPa · s) |  | 4.8 | 1.2 | 1.1 | 1 |
|  | pH |  | 13.9 | 13.1 | 12.4 | 12.8 |
| Production conditions | Dilution ratio |  | 100 | 70 | 50 | 50 |

TABLE 2-continued

| | | | | | | | |
|---|---|---|---|---|---|---|---|
| Treatment agent | K/Na content | $M_K$ (ppm) | | $1.0 \times 10^{-2}$ | $4.3 \times 10^{-1}$ | $2.0 \times 10^{-4}$ | $4.0 \times 10^{-5}$ |
| | | $M_{Na}$ (ppm) | | $1.0 \times 10^{-3}$ | $5.7 \times 10^{-3}$ | $1.4 \times 10^{-4}$ | $1.2 \times 10^{-4}$ |
| | | $M_K/M_{Na}$ | | $1.0 \times 10^{1}$ | $7.5 \times 10^{1}$ | $1.4 \times 10^{0}$ | $3.3 \times 10^{-1}$ |
| | Number of particles | Number of particles having particle size of 0.1 to 0.3 micrometers (per mL) | | $1.3 \times 10^{2}$ | $8.6 \times 10^{1}$ | $2.2 \times 10^{1}$ | $4.8 \times 10^{0}$ |
| | | Viscosity (mPa · s) | | 1.5 | 1 | 1 | 1 |
| | | pH | | 11.7 | 11.5 | 11.2 | 11.5 |
| | | Type | | Cleaning | Cleaning | Cleaning | Cleaning |
| Evaluation item | | Filterability evaluation | | Good | Very good | Very good | Very good |
| | | Foaming evaluation | | Good | Very good | Very good | Very good |
| | | Watermark evaluation | | Very good | Very good | Very good | Very good |

| | | | Comparative Example | | | | |
|---|---|---|---|---|---|---|---|
| | | | 1 | 2 | 3 | 4 | 5 |
| Semiconductor treatment composition (concentrated-type semiconductor treatment composition) | Compound A | TMAH | | | 0.01 | | |
| | | TEAH | | | | 0.03 | |
| | | TPAH | | | | | |
| | | TBAH | | | | | |
| | | Choline | | | | | |
| | | Ammonium hydroxide | | | | | 0.01 |
| | Water-soluble polymer | Polyacrylic acid (Mw = 700,000) | 0.1 | 0.3 | | 0.5 | 0.3 |
| | | Polyacrylic acid (Mw = 55,000) | | | | | |
| | | Polyacrylic acid (Mw = 6,000) | | | 0.01 | | |
| | | Polymaleic acid (Mw = 2,000) | | | | | |
| | Organic acid | Serine | | | | | |
| | | Cysteine | | | | | |
| | | N-Acetyl-L-cysteine | | | | | |
| | | Histidine | | | | | |
| | | Arginine | | | | | |
| | | Phenylalanine | | | | | 0.01 |
| | Amine | Monoethanolamine | 1 | 1 | | | |
| | | Hydroxylamines | | | | | |
| | Other | KOH | 0.5 | 0.7 | 0.5 | 0.5 | |
| | K/Na content | $M_K$ (ppm) | $3.5 \times 10^{3}$ | $4.9 \times 10^{3}$ | $4.5 \times 10^{3}$ | $5.0 \times 10^{3}$ | $1.0 \times 10^{0}$ |
| | | $M_{Na}$ (ppm) | $1.0 \times 10^{-1}$ | $7.0 \times 10^{-1}$ | $2.0 \times 10^{-4}$ | $3.0 \times 10^{-1}$ | $2.0 \times 10^{1}$ |
| | | $M_K/M_{Na}$ | $3.5 \times 10^{4}$ | $7.0 \times 10^{3}$ | $2.3 \times 10^{4}$ | $1.7 \times 10^{4}$ | $5.0 \times 10^{-2}$ |
| | Number of particles | Number of particles having particle size of 0.1 to 0.3 micrometers (per mL) | ND | $9.0 \times 10^{2}$ | ND | $1.2 \times 10^{3}$ | $6.0 \times 10^{2}$ |
| | | Viscosity (mPa · s) | 8 | 9 | 1.1 | 7 | 8 |
| | | pH | 13.9 | 13.8 | 12.9 | 13.2 | 13.6 |
| Production conditions | | Dilution ratio | 100 | 70 | 50 | 50 | 100 |
| Treatment agent | K/Na content | $M_K$ (ppm) | $3.5 \times 10^{1}$ | $7.0 \times 10^{1}$ | $9.0 \times 10^{1}$ | $1.0 \times 10^{2}$ | $1.0 \times 10^{-2}$ |
| | | $M_{Na}$ (ppm) | $1.0 \times 10^{-3}$ | $1.0 \times 10^{-2}$ | $4.0 \times 10^{-3}$ | $6.0 \times 10^{-3}$ | $2.0 \times 10^{-1}$ |
| | | $M_K/M_{Na}$ | $3.5 \times 10^{4}$ | $7.0 \times 10^{3}$ | $2.3 \times 10^{4}$ | $1.7 \times 10^{4}$ | $5.0 \times 10^{-2}$ |
| | Number of particles | Number of particles having particle size of 0.1 to 0.3 micrometers (per mL) | ND | $1.5 \times 10^{2}$ | ND | $2.9 \times 10^{2}$ | $7.2 \times 10^{1}$ |
| | | Viscosity (mPa · s) | 1.7 | 1.8 | 1 | 1.6 | 1.7 |
| | | pH | 12.1 | 11.9 | 11.5 | 11.8 | 11.7 |
| | | Type | Cleaning | Cleaning | Cleaning | Cleaning | Cleaning |
| Evaluation item | | Filterability evaluation | Bad | Bad | Good | Bad | Bad |
| | | Foaming evaluation | Bad | Good | Bad | Good | Good |
| | | Watermark evaluation | Bad | Good | Bad | Good | Good |

TABLE 3

| | | Example | | | | | | Comparative Example | | | |
|---|---|---|---|---|---|---|---|---|---|---|---|
| | | 24 | 25 | 26 | 27 | 28 | 29 | 6 | 7 | 8 | 9 |
| Semiconductor treatment composition (non-dilution-type semiconductor treatment composition) | Compound A | | | | | | | | | | |
| | TMAH | | | | | | | | | | |
| | TEAH | | | | | | 1.5 | | | 1 | |
| | Choline | | 3 | 3 | | | | | 2 | | 2 |
| | Monomethyltrihydroxyethylammonium hydroxide | 2.5 | | | | | | | | | |
| | Dimethylbis(2-hydroxyethyl)ammonium hydroxide | | | | | 2 | 1.5 | | | | |
| | Ammonium hydroxide | | | | 2 | | | | | | |
| Organic acid | Cysteine | 0.05 | | | | | | 0.1 | | | |
| | N-Acetyl-L-cysteine | | 0.1 | | | | | | | | |
| | Histidine | | | 0.1 | | | | | | | |
| | Arginine | | | | 0.05 | | | | 0.2 | | |
| Solvent | 2-P | 15 | | | | | | | | | |
| | DMI | | 10 | 10 | 15 | | | | | 30 | |
| | GBL | 30 | | | 30 | 30 | | 40 | | | |
| | PG | | | | | 10 | 35 | 15 | 30 | 20 | 45 |
| | PGME | | 30 | | 10 | | 15 | | 30 | | |
| | NMP | | | 30 | | | | | | | |
| | Sulfolane | | | | | 20 | | | | | 30 |
| Other | KOH | | | | | | 30 | 0.5 | | | |
| | $M_K$ (ppm) | $1.2 \times 10^3$ | $5.5 \times 10^2$ | $5.3 \times 10^2$ | $1.2 \times 10^3$ | $5.3 \times 10^2$ | $1.0 \times 10^2$ | $2.0 \times 10^4$ | $1.5 \times 10^2$ | $9.5 \times 10^2$ | $1.2 \times 10^{-2}$ |
| | $M_{Na}$ (ppm) | $1.5 \times 10^1$ | $5.0 \times 10^1$ | $1.0 \times 10^0$ | $1.5 \times 10^1$ | $1.0 \times 10^0$ | $5.0 \times 10^1$ | $1.0 \times 10^{-1}$ | $1.2 \times 10^2$ | $1.0 \times 10^{-2}$ | $1.7 \times 10^0$ |
| | $M_K/M_{Na}$ | $8.0 \times 10^1$ | $1.1 \times 10^1$ | $5.3 \times 10^2$ | $8.0 \times 10^1$ | $5.3 \times 10^2$ | $2.0 \times 10^0$ | $2.0 \times 10^5$ | $1.3 \times 10^{-4}$ | $9.5 \times 10^4$ | $7.1 \times 10^{-3}$ |
| Number of particles | Number of particles having particle size of 0.1 to 0.3 micrometers (per mL) | $9.0 \times 10^0$ | $4.0 \times 10^0$ | $1.1 \times 10^1$ | $1.2 \times 10^1$ | $1.1 \times 10^1$ | $5.5 \times 10^0$ | $1.2 \times 10^1$ | $2.0 \times 10^0$ | ND | $8.0 \times 10^0$ |
| | Viscosity (mPa·s) | 5.8 | 3.5 | 2.9 | 3.7 | 3 | 9.2 | 3.8 | 6 | 4.1 | 13 |
| | pH | >14 | >14 | >14 | >14 | >14 | >14 | >14 | >14 | >14 | >14 |
| Type of treatment agent | | Etching | Resist removal | Resist removal | Resist removal | Resist removal | Resist removal | Etching | Resist removal | Resist removal | Resist removal |
| Evaluation item | Filterability evaluation | Good | Very good | Very good | Very good | Very good | Good | Bad | Bad | Good | Bad |
| | Foaming evaluation | Very good | Very good | Very good | Very good | Very good | Good | Good | Good | Bad | Bad |
| | Watermark evaluation | Very good | Very good | Very good | Very good | Very good | Very good | Good | Good | Bad | Bad |

In Tables 1 to 3, the unit for the amount (ratio) of each component is "parts by mass". In each example and comparative example, the total amount of the components was 100 parts by mass, and the balance was ion-exchanged water. The details of each component listed in Tables 1 to 3 are as follows.

<Compound A>
- TMAH (tetramethylammonium hydroxide): manufactured by Hayashi Pure Chemical Ind., Ltd.
- TEAH (tetraethylammonium hydroxide): manufactured by Junsei Chemical Co., Ltd.
- TPAH (tetrapropylammonium hydroxide): manufactured by Wako Pure Chemical Industries, Ltd.
- TBAH (tetrabutylammonium hydroxide): manufactured by Wako Pure Chemical Industries, Ltd.
- Choline: manufactured by Tama Chemicals Co., Ltd.
- Ammonium hydroxide: manufactured by Wako Pure Chemical Industries, Ltd. Used as ammonia water containing 28% to 30% ammonia (the numerical values in Table are ammonium hydroxide reduced values)
- Monomethyltrihydroxyethylammonium hydroxide: manufactured by Yokkaichi Chemical Co., Ltd.
- Dimethylbis(2-hydroxyethyl)ammonium hydroxide: manufactured by Yokkaichi Chemical Co., Ltd.

<Water-Soluble Polymer>
- Polyacrylic acid (Mw=700,000): "JURYMER AC-10H" manufactured by Toagosei Co., Ltd.
- Polyacrylic acid (Mw=55,000): "JURYMER AC-100L" manufactured by Toagosei Co., Ltd.
- Polyacrylic acid (Mw=6,000): "ARON A-10SL" manufactured by Toagosei Co., Ltd.
- Polymaleic acid (Mw=2,000): "NONPOL PWA-50W" manufactured by NOF Corporation
- Styrene-maleic acid copolymer: "DKS DISCOAT N-10" manufactured by DKS Co. Ltd.
- Styrene-maleic acid half ester copolymer: "DKS DISCOAT N-14" manufactured by DKS Co. Ltd.
- Naphthalenesulfonic acid-formalin condensate Na salt: "LAVELIN FD-40" manufactured by DKS Co. Ltd.

<Organic Acid>
- Serine: manufactured by Nippon Rika Co., Ltd.
- Cysteine: manufactured by Nippon Rika Co., Ltd.
- N-Acetyl-L-cysteine: manufactured by Nippon Rika Co., Ltd.
- Histidine: manufactured by Nippon Rika Co., Ltd.
- Arginine: manufactured by Nippon Rika Co., Ltd.
- Phenylalanine: manufactured by Kyowa Hakko Bio Co., Ltd.
- Benzoic acid: manufactured by DMS Japan
- Hydroxyphenyllactic acid: manufactured by Tokyo Kasei Kogyo Co., Ltd.
- Phenylsuccinic acid: manufactured by Tokyo Kasei Kogyo Co., Ltd.
- Naphthalenesulfonic acid: manufactured by Wako Pure Chemical Industries, Ltd.

<Amine>
- Monoethanolamine: manufactured by Hayashi Pure Chemical Ind., Ltd.
- Hydroxylamines: manufactured by Tokyo Kasei Kogyo Co., Ltd.
- Isopropanolamine: manufactured by Toko Chemicals Inc.

<Solvent>
- 2-P (2-pyrrolidone): manufactured by Wako Pure Chemical Industries, Ltd.
- DMI (1,3-dimethyl-2-imidazolidinone): manufactured by Tokyo Kasei Kogyo Co., Ltd.
- GBL (gamma-butyrolactone): manufactured by Tokyo Kasei Kogyo Co., Ltd.
- PG (propylene glycol): manufactured by Wako Pure Chemical Industries, Ltd.
- PGME (propylene glycol monomethyl ether): manufactured by Sankyo Chemical Co., Ltd.
- NMP (N-methylpyrrolidone): manufactured by Mitsubishi Chemical Corporation
- Sulfolane: manufactured by Sankyo Chemical Co., Ltd.

<Other>
- KOH: manufactured by Kanto Chemical Co., Inc. (pH-adjusting agent)

As is clear from Tables 1 to 3, the semiconductor treatment compositions of Examples 1 to 29 had an excellent filtration characteristic, and thus high productivity was achieved. When the semiconductor treatment compositions of Examples 1 to 29 were used, foaming characteristic was reduced, the number of defects (water marks) was also small on the surface of the substrate in all of the compositions, and an excellently treated state of the polishing target could be obtained.

The invention is not limited to the embodiments described above. Various modifications and variations may be made of the embodiments described above. For example, the invention includes various other configurations substantially the same as the configurations described above in connection with the embodiments (e.g., a configuration having the same function, method, and results, or a configuration having the same objective and results). The invention also includes a configuration in which an unsubstantial element described above in connection with the embodiments is replaced by another element. The invention also includes a configuration having the same effects as those of the configurations described above in connection with the embodiments, or a configuration capable of achieving the same objective as that of the configurations described above in connection with the embodiments. The invention further includes a configuration in which a known technique is added to the configurations described above in connection with the embodiments.

Although only some embodiments of the invention have been described in detail above, those skilled in the art would readily appreciate that many modifications are possible in the embodiments without materially departing from the novel teachings and advantages of the invention. Accordingly, all such modifications are intended to be included within the scope of the invention.

What is claimed is:

1. A treatment method, comprising:
   treating a wiring board that contains tungsten as a wiring material by using a concentrated semiconductor treatment composition, after subjecting the wiring board to chemical mechanical polishing by using a composition comprising iron ions and peroxides,
   wherein the concentrated semiconductor treatment composition comprises:
   potassium;
   sodium;
   a water-soluble polymer having a weight average molecular weight of 1,000 to 1,500,000; and
   a compound A represented by the following general formula (1),
   wherein the concentrated semiconductor treatment composition has a potassium content $M_K$ (ppm) and a sodium content $M_{Na}$ (ppm) that satisfy $M_K/M_{Na}=1\times 10^{-1}$ to $1\times 10^4$:

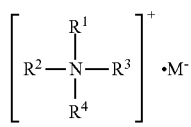

(1)

wherein each of $R^1$ to $R^4$ is a hydrogen atom or an organic group, independently, and $M^-$ is an anion.

2. The treatment method according to claim 1, wherein the concentrated semiconductor treatment composition is used in a 20 to 500-fold diluted state.

3. The treatment method according to claim 1, wherein the concentrated semiconductor treatment composition has a viscosity of less than 5 mPa·s at 25° C.

4. The treatment method according to claim 1, wherein the concentrated semiconductor treatment composition further comprises an amino acid.

5. The treatment method according to claim 1, wherein the water-soluble polymer in the concentrated semiconductor treatment composition has a weight average molecular weight of 3,000 to 1,200,000.

6. The treatment method according to claim 1, wherein the potassium content $M_K$ (ppm) is $1\times10^{-4}$ to $5\times10^3$ ppm, and the sodium content $M_{Na}$ (ppm) is $1\times10^{-6}$ to $1\times10^2$ ppm.

7. A treatment method, comprising:
   treating a wiring board that contains tungsten as a wiring material by using a semiconductor treatment composition, after subjecting the wiring board to chemical mechanical polishing by using a composition comprising iron ions and peroxides,
   wherein the semiconductor treatment composition comprises:
   potassium;
   sodium;
   a water-soluble polymer having a weight average molecular weight of 1,000 to 1,500,000; and
   a compound A represented by the following general formula (1),
   wherein the semiconductor treatment composition is suitable for being used without being diluted, and
   the semiconductor treatment composition has a potassium content $M_K$ (ppm) and a sodium content $M_{Na}$ (ppm) that satisfy $M_K/M_{Na}=1\times10^{-1}$ to $1\times10^4$:

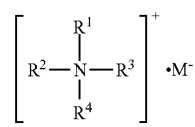

(1)

wherein each of $R^1$ to $R^4$ is a hydrogen atom or an organic group, independently, and $M^-$ is an anion.

8. The treatment method according to claim 7, wherein the semiconductor treatment composition has a viscosity of less than 5 mPa·s at 25° C.

9. The treatment method according to claim 7, wherein the semiconductor treatment composition further comprises an amino acid.

10. The treatment method according to claim 7, wherein the water-soluble polymer in the semiconductor treatment composition has a weight average molecular weight of 3,000 to 1,200,000.

11. The treatment method according to claim 7, wherein the potassium content $M_K$ (ppm) is $1\times10^{-6}$ to $5\times10^3$ ppm, and the sodium content $M_{Na}$ (ppm) is $1\times10^{-8}$ to $1\times10^2$ ppm.

* * * * *